United States Patent
Sawaoka et al.

(10) Patent No.: US 8,467,441 B2
(45) Date of Patent: Jun. 18, 2013

(54) PULSE WIDTH MODULATION COMMUNICATION SYSTEM

(75) Inventors: Hideo Sawaoka, Kariya (JP); Yasuaki Makino, Okazaki (JP); Toshihiko Matsuoka, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 162 days.

(21) Appl. No.: 13/157,906

(22) Filed: Jun. 10, 2011

(65) Prior Publication Data

US 2011/0310954 A1    Dec. 22, 2011

(30) Foreign Application Priority Data

Jun. 16, 2010   (JP) .................................. 2010-137495

(51) Int. Cl.
*H03K 7/08* (2006.01)
(52) U.S. Cl.
USPC ......................................... 375/238; 375/259
(58) Field of Classification Search
USPC ........................... 375/238, 256, 259, 356, 358
See application file for complete search history.

(56) References Cited

U.S. PATENT DOCUMENTS

| 2007/0029977 A1* | 2/2007 | Asada .............................. 322/24 |
| 2008/0174450 A1 | 7/2008 | Tanizawa |
| 2012/0262998 A1* | 10/2012 | Kizer et al. ................... 365/193 |

FOREIGN PATENT DOCUMENTS

| JP | A-06-284100 | 10/1994 |
| JP | A-07-007490 | 1/1995 |

OTHER PUBLICATIONS

"Surface Vehicle Information Report" from the Society of Automotive Engineers (SAE) International, pp. 1-18 (Revised Feb. 2008) (Discussed on p. 2 of the Specification).

* cited by examiner

*Primary Examiner* — Emmanuel Bayard
(74) *Attorney, Agent, or Firm* — Posz Law Group, PLC

(57) ABSTRACT

In a PWM communication system, a sensor unit transmits as reference pulses transmission signals, which exhibit duty cycles of 100% and 0%, respectively, prior to transmission of a transmission signal, which has data items compressed thereinto by a signal processing circuit. An input capture circuit of an ECU measures the duty time and the PWM cycle of the transmission signal according to a timer clock of a timer circuit. A signal processing circuit of the ECU produces a duty cycle correction factor k based on the measured duty times and PWM cycles of the reference pulses, produces receiving data based on the duty time and the PWM cycle of the transmission signal, and the duty cycle correction factor, and separates the receiving data into sensor output values of a pressure sensor and a temperature sensor.

10 Claims, 15 Drawing Sheets

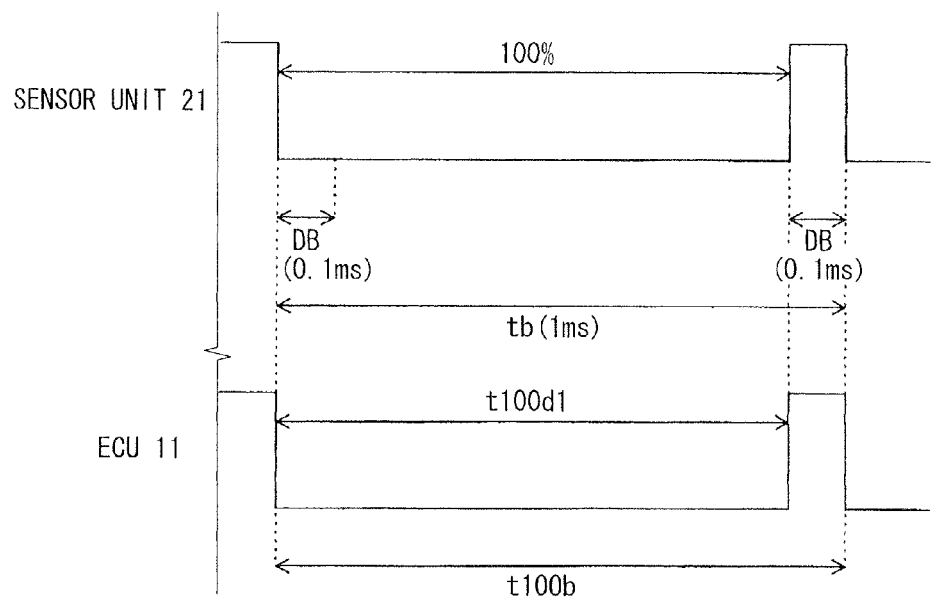
FIG. 3A  SG : 100% DUTY
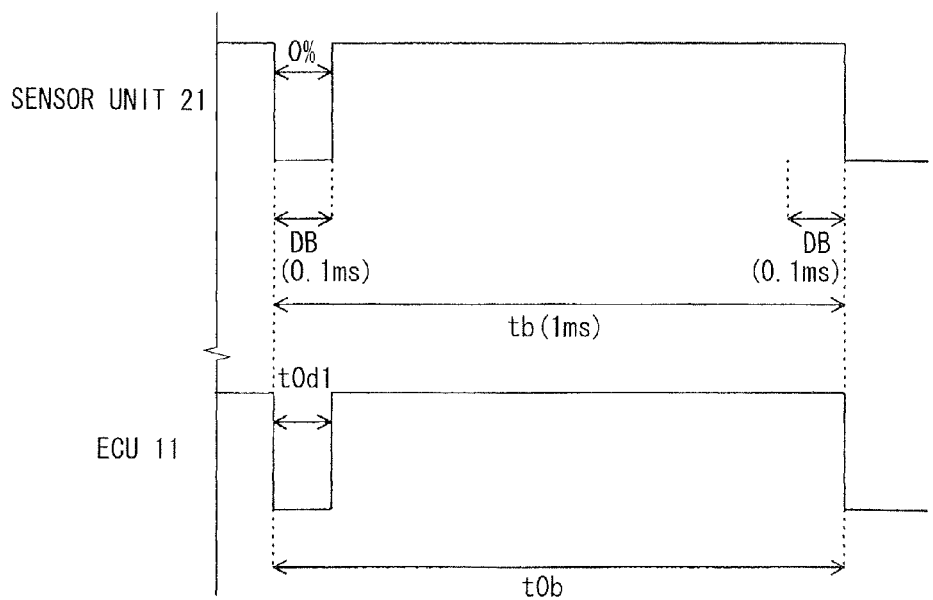
FIG. 3B  SG : 0% DUTY

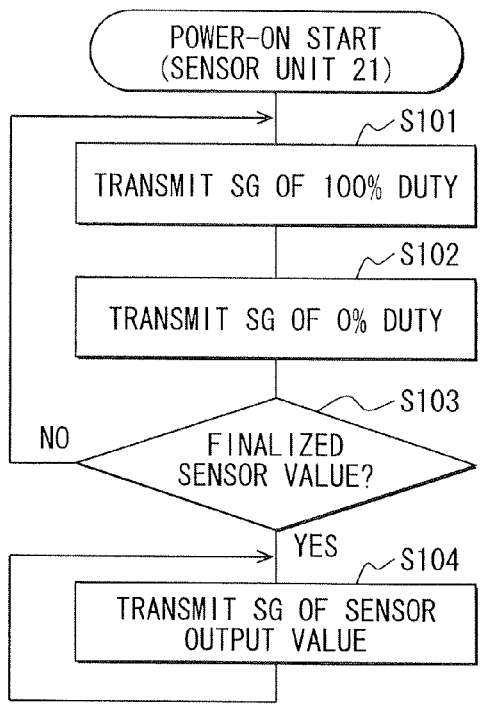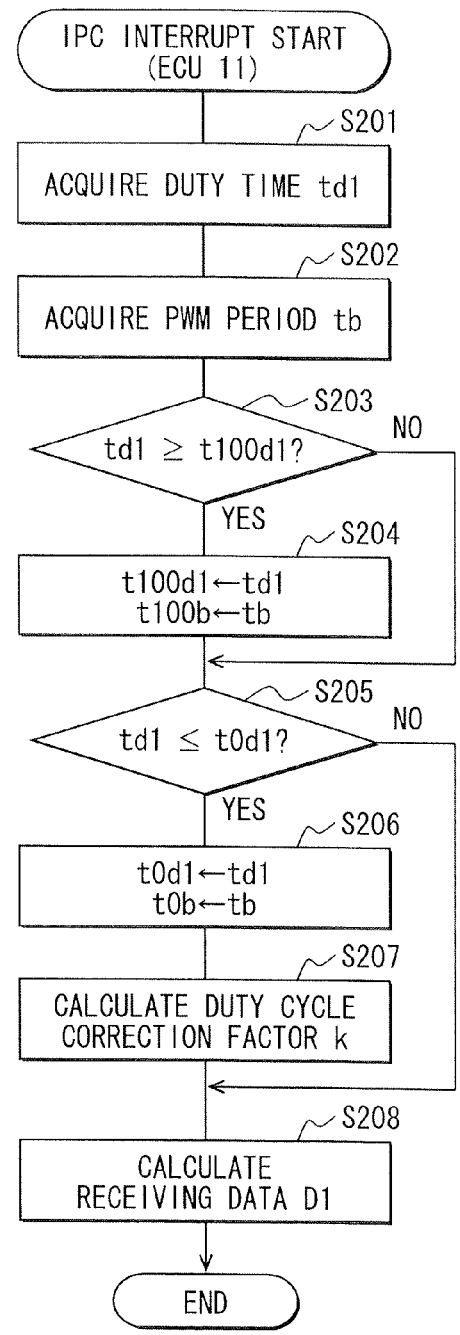

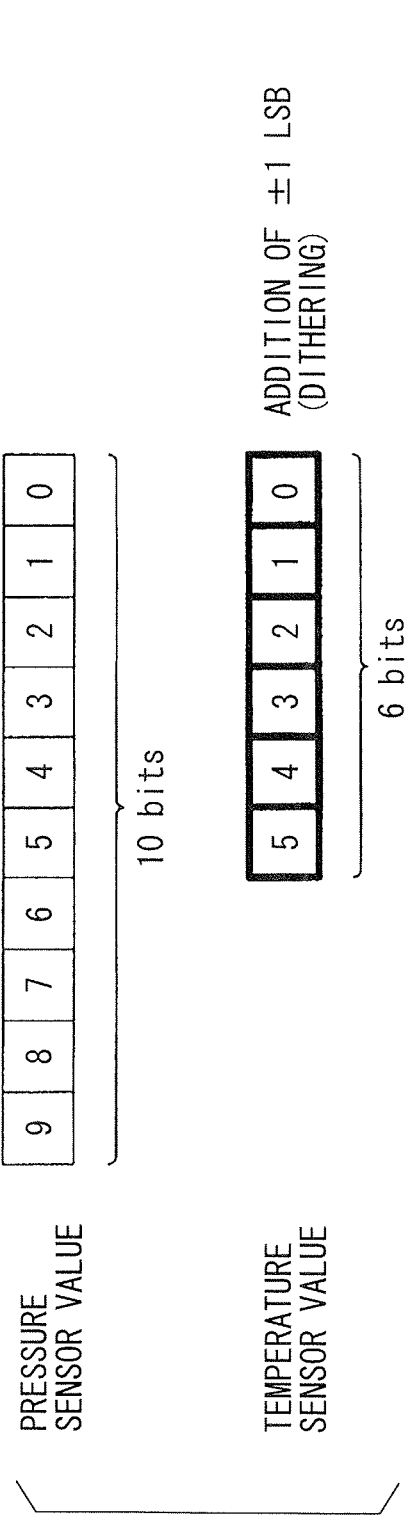
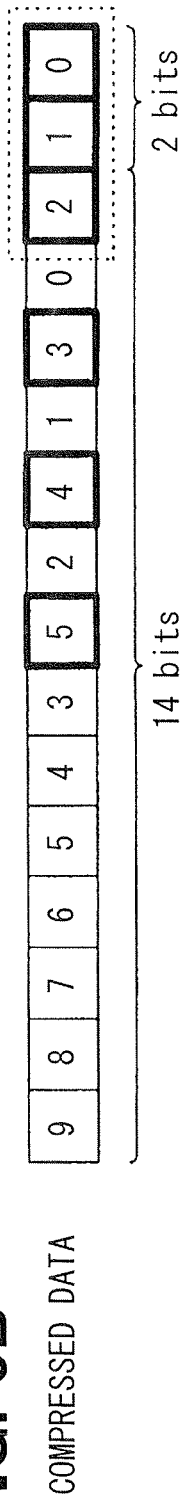
FIG. 6A
FIG. 6B

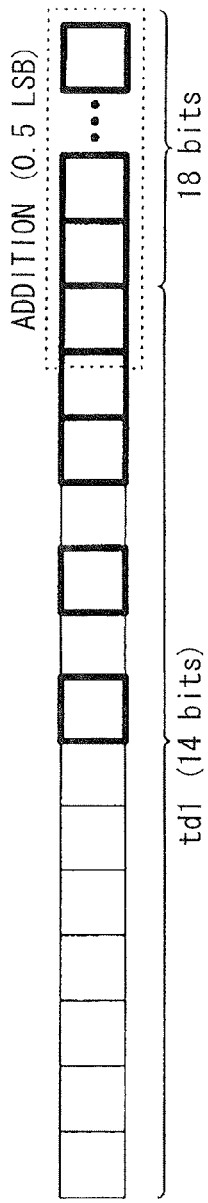
FIG. 7A
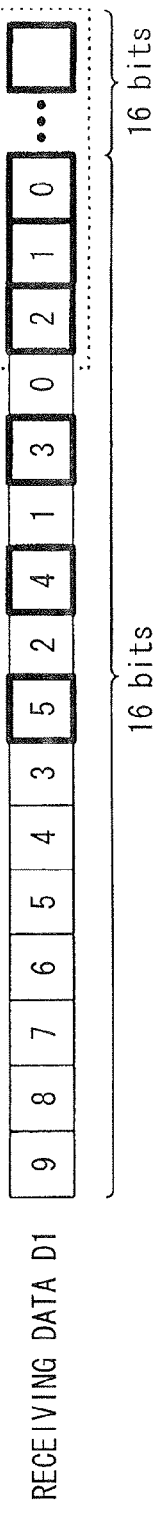
FIG. 7B RECEIVING DATA D1
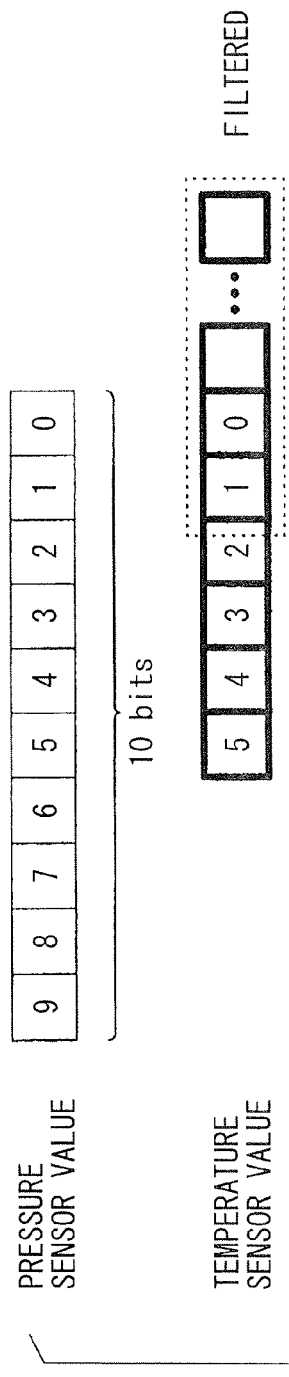
FIG. 7C PRESSURE SENSOR VALUE / TEMPERATURE SENSOR VALUE
FIG. 7D TEMPERATURE SENSOR VALUE FIG. 13A  SG : 100% DUTY
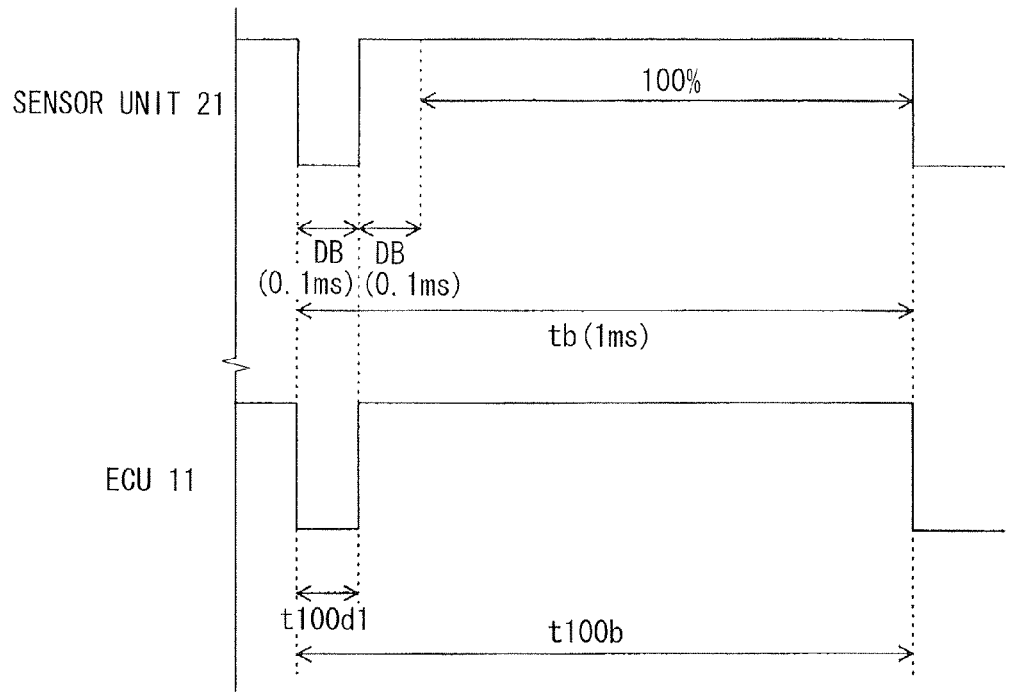
FIG. 13B  SG : 0% DUTY
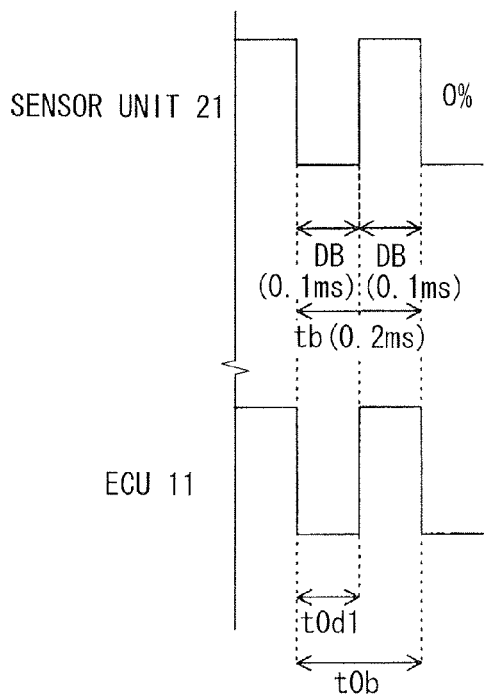

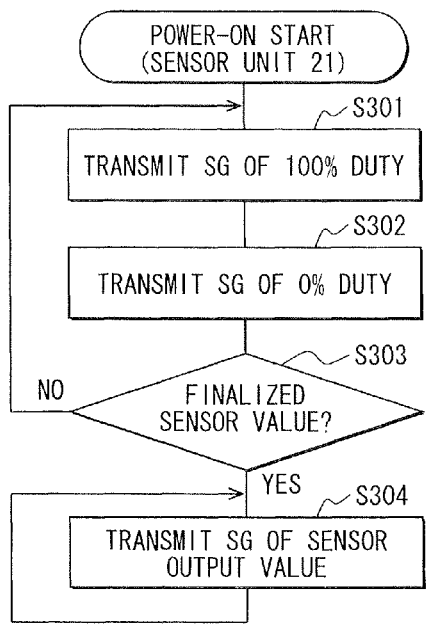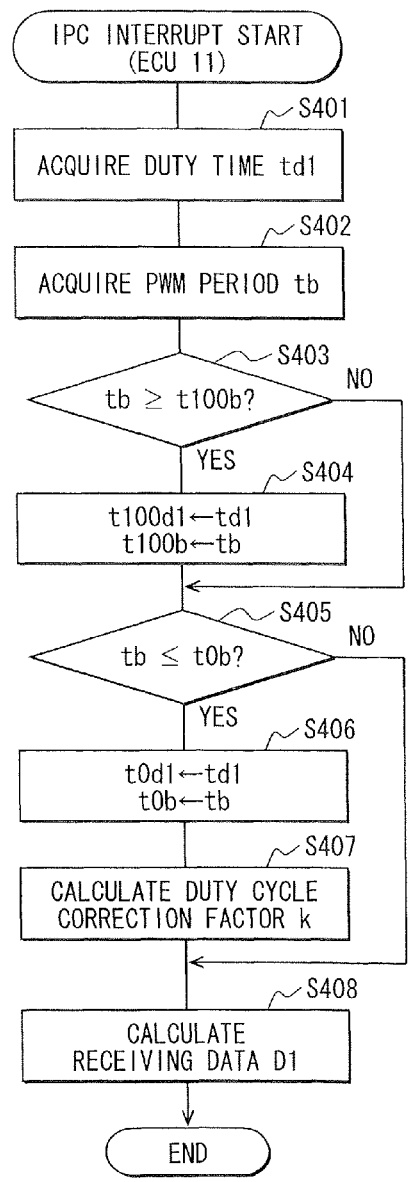

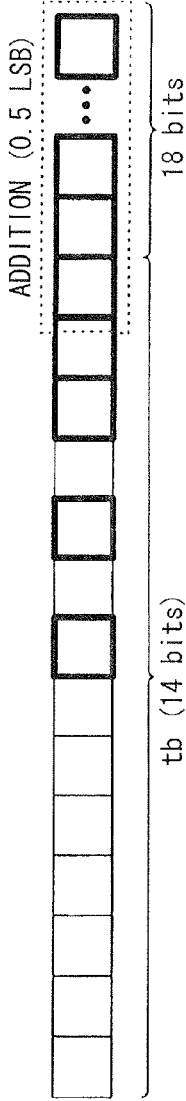
FIG. 16A
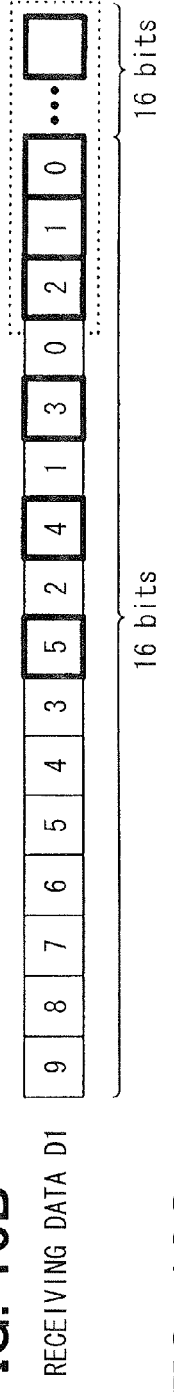
FIG. 16B RECEIVING DATA D1
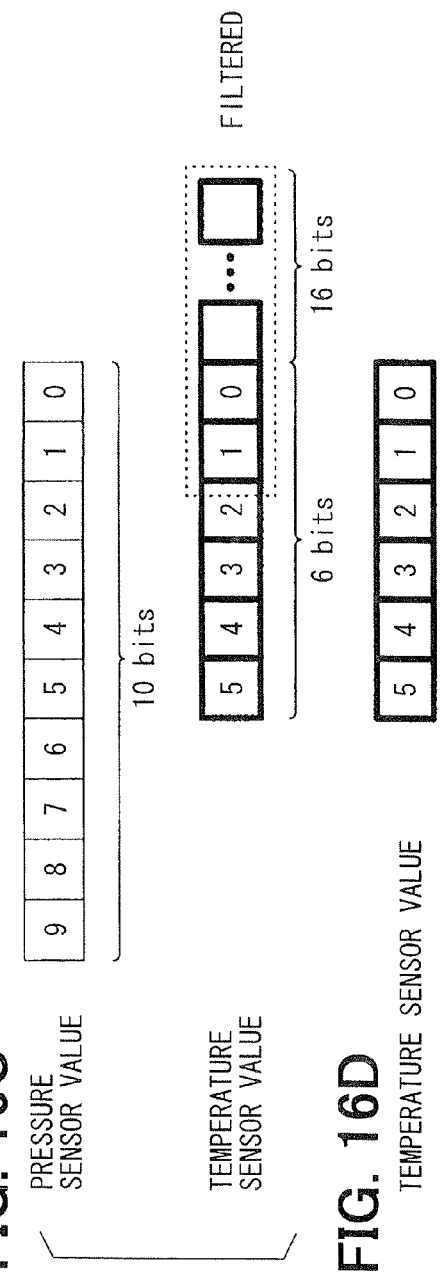
FIG. 16C PRESSURE SENSOR VALUE / TEMPERATURE SENSOR VALUE
FIG. 16D TEMPERATURE SENSOR VALUE

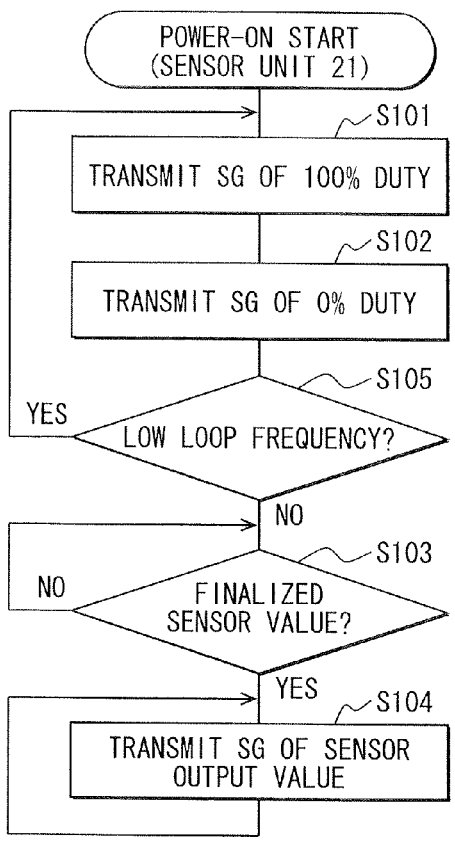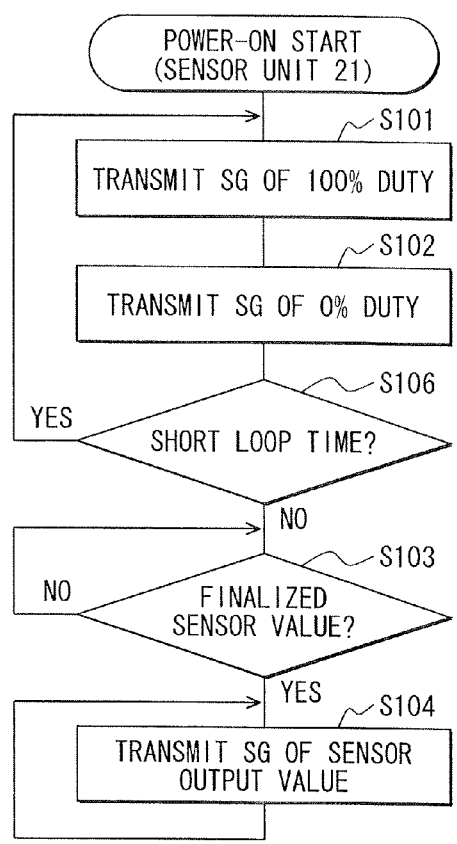

PULSE WIDTH MODULATION COMMUNICATION SYSTEM

CROSS REFERENCE TO RELATED APPLICATION

This application is based on and incorporates herein by reference Japanese patent application No. 2010-137495 filed on Jun. 16, 2010.

FIELD OF THE INVENTION

The present invention relates to a pulse width modulation (PWM) communication system.

BACKGROUND OF THE INVENTION

Patent document 1 (JP 2008-180596A, US 2008/0174450) discloses a PWM output type sensor circuit that outputs a PWM output signal, which has a pulse width associated with a value of a physical quantity, as information concerning the physical quantity.

Patent document 2 (JP H06-284100) discloses a technology implemented in a multiplex communication method, in which plural analog signals that should be transmitted are pulse-width modulated and then time-division multiplexed, the multiplexed pulse width-modulated signals are transmitted over a sole transmission line, the signals are received over the transmission line in order to detect synchronous information, and the plural pulse-width modulated signals are demultiplexed from the received signals on the basis of the detected synchronous information. According to the technology, while the timing of delivering the pulse-width modulated signal onto the transmission line is circulated among a greater number of timings than the number of analog signals that should be transmitted, the plural pulse-width modulated signals whose rising timings are controlled to be constant are delivered onto the transmission line at associated delivery timings, and a period during which no pulse-width modulated signal is delivered is detected as the synchronous information.

Patent document 3 (JP H07-7490) discloses a pulse multiplex transmission method. According to the pulse multiplex transmission method, in a transmitting unit, a first pulse width modulator sequentially multiplexes plural digital signals into a first pulse-width modulated signal stream, a second pulse width modulator sequentially multiplexes other plural digital signals into a second pulse-width modulated signal stream that has a reverse polarity of the polarity of the first pulse-width modulated signal stream, and a multiplexer multiplexes the first pulse-width modulated signal stream and second pulse-width modulated signal stream. In a receiving unit that receives a multiplexed pulsating signal produced by the transmitting unit, after an ac-coupled amplifier amplifies the multiplexed pulsating signal into a pulsating signal having a predetermined amplitude, a subtractor, a first pulse-width demodulator, and a second pulse-width demodulator sequentially separate the plural original digital signals from one another so as to reproduce the original digital signals.

Non-patent document 1 ("Surface Vehicle Information Report" from the Society of Automotive Engineers (SAE) International (J2716 Revised February 2008, SENT for Automotive Application)) discloses a single edge nibble transmission (SENT) communication technology for decreasing the number of communication pulses per unit time. Herein, since an output signal of a sensor is divided into plural pulsating outputs in units is of four bits, a pulse serving as a reference for correction is transmitted as a leading pulse, and a quantity to be corrected with the trailing pulse is supposed to be an estimate. When multiple data items are communicated, a message identification (ID) is assigned to each of the data items in order to treat the data items independently.

For communications among various kinds of sensors (for example, a pressure sensor, a temperature sensor, an optical sensor, and a slope sensor), which are mounted in a vehicle, and an on-board electronic control unit (ECU), signal lines are provided for the respective sensors.

However, in recent years, it is requested to decrease the number of signal lines by integrating plural sensors, and multiplex sensor output values (detection signals) of the plural sensors so as to communicate the sensor output values, and thus reduce a cost.

For example, when a pressure sensor output value detected by a pressure sensor is transmitted to the ECU, a change in a pressure is accompanied by a temperature change according to a gas state equation.

Therefore, it is requested to highly precisely implement various controls in a vehicle on the basis of an accurate pressure sensor output value. Specifically, the pressure sensor and a temperature sensor are integrated. When the pressure sensor is used to detect a pressure sensor output value, the temperature sensor is used to detect a temperature sensor output value at the same time. The pressure sensor output value and temperature sensor output value are multiplexed and communicated to the ECU, and the ECU corrects the pressure sensor output value on the basis of the temperature sensor output value.

In practice, a total of three wiring harnesses including a wiring harness that is an analog signal line over which analog signals of sensor output values are communicated, a wiring harness that is a positive power line, and a wiring harness that is a ground line are used to connect the sensors and ECU.

In the ECU, the analog signals of sensor output values are analog-to-digital converted. It is likely that the precision in digital signals produced through the analog-to-digital conversion may be degraded due to an adverse effect of noises convoluted to the ground line. Therefore, in the ECU, a digital filter is applied to the analog-to-digital converted signals in order to remove the noises.

However, when the number of data sampling times is increased in order to improve the noise removing performance of the digital filter in the ECU, the responsiveness of a sensor output value may be degraded.

After a sensor output value is converted into a digital signal, when the digital signal is transmitted to the ECU, the adverse effect of the noises can be avoided. However, high timer precision is needed in order to realize high-speed communication.

For example, when multiplex communication is performed by utilizing controller area network (CAN) communication, it is possible to correct timer precision. However, a circuit dedicated to the correction of the timer precision has to be included. The inclusion of the dedicated circuit increases costs.

The patent document 1 discloses a technology for convoluting information relevant to a value of a physical quantity to a PWM output signal by determining a crest value of the PWM output signal in relation to the value (temperature information) of the physical quantity other than a certain physical quantity (a battery current value).

According to the technology, a dedicated circuit has to be included in an ECU in order to detect the crest value of the PWM output signal. As a result, cost is increased due to the inclusion of the dedicated circuit.

For PWM communication between a sensor and an ECU, normally, an output comparison circuit is included in the sensor and an input capture circuit is included in the ECU. A timer clock is fed from different timer circuits to the output comparison circuit and input capture circuit respectively.

Therefore, even when the input capture circuit exhibits an excellent timer resolution, a variance occurs in the precision in a pulse width of a sensor output value due to a difference between the timer resolution of the input capture circuit and the timer resolution of the output comparison circuit. Restrictions are therefore imposed on an amount of data capable of being communicated. Therefore, the technology is not satisfactory for multiplex communication.

The timer resolution of the input capture circuit refers to a cycle of a timer clock of a timer circuit included in the input capture circuit. The timer resolution of the output comparison circuit refers to a cycle of a timer clock of a timer circuit included in the output comparison circuit.

A variance in the precision (timer precision) in the pulse width between the timer clocks produced by the respective timer circuits included in the input capture circuit and output comparison circuit respectively leads to a difference in the timer resolution between the input capture circuit and output comparison circuit. Therefore, the difference in the timer resolution refers to a timer-precision difference.

The technology in the patent document 2 addresses a problem that high-speed communication is hard to do because a communication time is extended by a time that is a sum of a time required to circulate the timing of delivering a pulse-width modulated signal onto a transmission line among a greater number of timings than the number of analog signals that should be transmitted, a time required to deliver plural pulse-width modulated signals, which have rising timings thereof controlled to be constant, onto the transmission line at the associated delivery timings, and a time required to send synchronous information.

The technology in the patent document 3 addresses a problem that a communication time is long and high-speed communication is hard to do. This is because since one pulse of a PWM signal is used to transmit or receive one bit of a digital signal, numerous pulses are needed to communicate all data items.

Another problem of the technology in the patent document 3 is that, since modulating or demodulating processing is performed using a pulse-width modulator or a pulse-width demodulator, an error is caused in the modulating or demodulating processing.

In addition, according to the technology in the patent document 3, since special circuits such as the pulse-width modulator and pulse-width demodulator and an ac-coupled amplifier have to be included, a cost is increased due to the inclusion of the special circuits.

The technology in the non-patent document 1 addresses a problem that, since numerous pulses are needed to communicate all data items, the communication time is long and high-speed communication is hard to do.

In addition, according to the technology in the non-patent document 1, since interrupt processing is performed for each pulse in an ECU, when high-speed communication is performed, the interrupt processing has to be performed frequently. Eventually, processing other than communication to be performed in an ECU is retarded.

SUMMARY OF THE INVENTION

It is therefore an object of the present invention to provide a PWM communication system, which can perform high-precision multiplex communication, at a low cost.

According to one aspect of the present invention, a PWM communication system comprises a transmitting device that transmits a transmission signal, a receiving device that receives the transmission signal transmitted from the transmitting device, and a signal line connecting the transmitting device and the receiving device.

In the transmitting device, a transmitting-side signal processing circuit multiplexes a plurality of digital signals to produce a digital data signal of one data having data items compressed thereinto. A transmitting-side timer circuit produces a transmitting-side timer clock. A transmission circuit produces and transmits the transmission signal including the digital data signal according to the transmitting-side timer clock produced by the transmitting-side timer circuit. The transmission signal is a series of PWM signals, each of which has a PWM cycle and has a duty time. The transmitting device produces and transmits reference pulses prior to transmission of the digital data signal.

In the receiving device, a receiving-side timer circuit produces a receiving-side timer clock. A measurement circuit measures the duty time and the PWM cycle of the transmission signal according to the receiving-side timer clock produced by the receiving-side timer circuit. A receiving-side signal processing circuit that produces a correction factor based on duty times and PWM cycles of the reference pulses measured by the measurement circuit, produces receiving data based on the duty times and the PWM cycles of the digital dada signal, which are measured by the measurement circuit, as well as the correction factor, and separates the receiving data into a plurality of digital signals, which corresponds to the digital signals multiplexed by the transmitting-side signal processing circuit.

In one example, the PWM cycle is fixed and the duty time is variable. However, the reference pulses have 100% duty time and 0% duty time, respectively. The correction factor corrects the measured duty time of the PWM signal in the digital data signal.

In the other example, the PWM cycle is variable and the duty time is fixed. However, the reference pulses have 100% PWM cycle and 0% PWM cycle, respectively. The correction factor corrects the measured PWM cycle of the PWM signal in the digital data signal.

BRIEF DESCRIPTION OF THE DRAWINGS

The above and other objects, features and advantages of the present invention will become more apparent from the following detailed description made with reference to the accompanying drawings. In the drawings:

FIG. 3A is a waveform diagram showing a relationship, which is established in the first embodiment when the transmission signal exhibits a duty cycle of 100%, among the transmission signal sent from the sensor unit, and a duty time and a PWM cycle of the transmission signal received by an ECU which are measured by an input capture circuit;

FIG. 3B is a waveform diagram showing a relationship, which is established in the first embodiment when the transmission signal exhibits a duty cycle of 0%, among the transmission signal sent from the sensor unit, and the duty time and the PWM cycle of the transmission signal received by the ECU which are measured by the input capture circuit;

FIG. 4 is a flowchart for use in explaining an operation of the sensor unit included in the first embodiment;

FIG. 5 is a flowchart for use in explaining an input capture interrupt processing operation of the ECU included in the first embodiment;

FIG. 6A and FIG. 6B are explanatory diagrams for use in explaining an operation which a signal processing circuit 26 of the sensor unit 21 performs during the processing shown in FIG. 4;

FIG. 7A to FIG. 7D are explanatory diagrams for use in explaining operations which a signal processing circuit of the ECU performs during the processing shown in FIG. 5;

FIG. 13A is a waveform diagram showing a relationship, which is established in the fourth embodiment when the transmission signal exhibits a duty cycle of 100%, among the transmission signal sent from the sensor unit, and a duty time and a PWM cycle of the transmission signal received by the ECU which are measured by the input capture circuit;

FIG. 13B is a waveform diagram showing a relationship, which is established in the fourth embodiment when the transmission signal exhibits a duty cycle of 0%, among the transmission signal sent from the sensor unit, and the duty time and the PWM cycle of the transmission signal received by the ECU which are measured by the input capture circuit;

FIG. 14 is a flowchart for use in explaining an operation of the sensor unit included in the fourth embodiment;

FIG. 15 is a flowchart for use in explaining an input capture (IPC) interrupt processing operation of the ECU 11 included in the fourth embodiment;

FIG. 16A to FIG. 16D are explanatory diagrams for use in explaining operations which a signal processing circuit included in the ECU performs during the processing shown in FIG. 15;

FIG. 17 is a flowchart for use in explaining an operation of a sensor unit included in a fifth embodiment of the present invention; and FIG. 18 is a flowchart for use in explaining an operation of a sensor unit included in a sixth embodiment of the present invention.

DETAILED DESCRIPTION OF THE PREFERRED EMBODIMENTS

Figure 1:
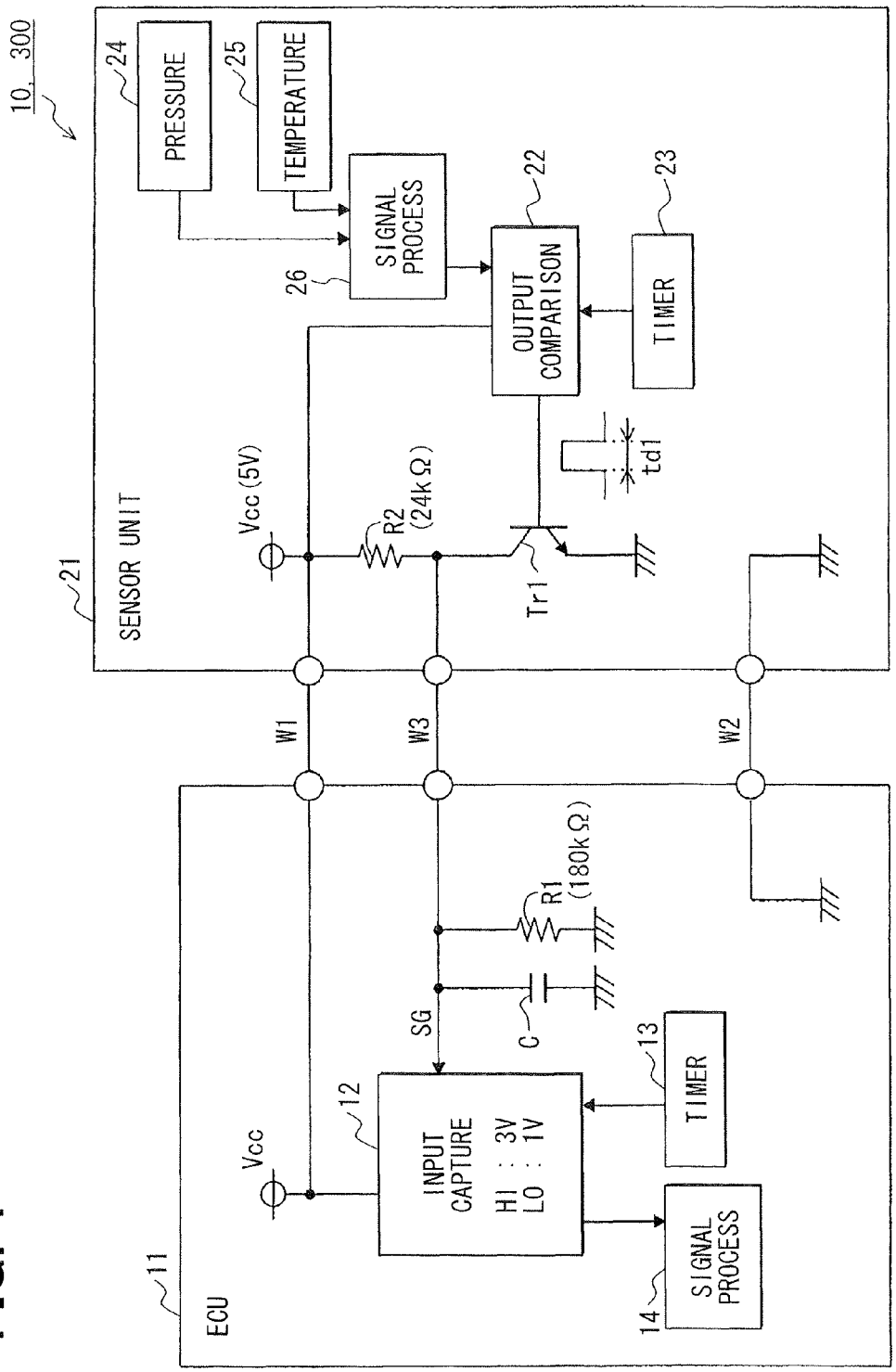
FIG. 1 is a block circuit diagram showing an entire configuration of a PWM communication system in accordance with a first or fourth embodiment of the present invention.

Referring to the drawings, embodiments of the present invention will be described below. In relation to the embodiments, the same reference numerals will be assigned to identical component parts or elements so that same description will be omitted.

First Embodiment

Referring to FIG. 1, a PWM communication system 10 in accordance with a first embodiment includes an ECU 11 provided as a receiving device, a sensor unit 21 provided as a transmitting device, and wiring harnesses W1 to W3 that connect the ECU 11 and sensor unit 21, and is mounted in a vehicle.

The ECU 11 includes an input capture (IPC) circuit 12, a timer circuit 13, a signal processing circuit 14, a capacitor C, and a resistor R1, and has a microcomputer (not shown) that operates in a 32-bit architecture.

The sensor unit 21 includes an output comparison (OC) circuit 22, a timer circuit 23, a pressure sensor 24, a temperature sensor 25, a signal processing circuit 26, an npn transistor Tr1, and a resistor R2. The pressure sensor 24 and the temperature sensor 25 are integrated into a single body.

The wiring harness W1 of positive power lines is coupled to a positive terminal of an onboard battery (not shown), has a positive power Vcc applied thereto, and feeds the positive power Vcc to the internal circuits of the ECU 11 and sensor unit 21.

The wiring harness W2 of ground lines is coupled to a negative terminal of the onboard battery, and coupled to ground terminals of the internal circuits of the ECU 21 and sensor unit 21.

The pressure sensor 24 detects a pressure at a position of detection (not shown) in the vehicle, and produces a sensor output value (detection signal) of an analog signal that is proportional to the pressure.

Based on a gas state equation, a change in a pressure is accompanied by a temperature change. In addition, the timer precision (precision in a pulse width of a timer clock) of the timer circuit 23 may vary depending on a temperature characteristic.

Therefore, the temperature sensor 25 detects the temperature at a position near the position of detection by the pressure sensor 24, and produces a sensor output value of an analog signal proportional to the temperature.

The signal processing circuit 26 converts the sensor output value of the pressure sensor 24 (pressure sensor output value) into a corresponding digital signal (data), converts the sensor output value of the temperature sensor 25 (temperature sensor output value) into a corresponding digital signal (data), and multiplexes the digital signal of the pressure sensor output value and the digital signal of the temperature sensor output value so as to thus produce a digital data signal of one data having the data items compressed thereinto.

The output comparison circuit 22 operates according to a timer clock produced by the timer circuit 23, produces a PWM signal, which exhibits a duty time (that is, a pulse width) td1, on the basis of the digital signal produced by the signal processing circuit 26, and applies the PWM signal to the gate of the transistor Tr1.

The emitter of the transistor Tr1 is grounded, and the collector thereof is connected to the positive power supply Vcc via the resistor R2.

Therefore, from the collector of the transistor Tr1, a PWM signal having a reverse of the logic level of the PWM signal outputted from the output comparison circuit 22 is transmitted (outputted) as a transmission signal (output signal) SG, which includes the digital data signal of a series of PWM signals.

The transmission signal SG of the sensor unit 21 is transmitted to the ECU 11 over the wiring harness W3 that is a digital signal line (PWM signal line).

The input capture circuit 12 of the ECU 11 receives (inputs) the transmission signal SG sent over the wiring harness W3.

Therefore, the transmission signal SG of the sensor unit 21 becomes a receiving signal of the ECU 11.

In the ECU 11, the capacitor C and resistor R1 are connected in parallel with each other between the input port of the input capture circuit 12 and the ground.

The capacitor C is included in a low-pass filter circuit, and removes a high-frequency noise contained in the transmission signal SG of the sensor unit 21. The resistors R1 and R2 are included in order to restrict the voltage level of the transmission signal SG of the sensor unit 21 to a predetermined voltage value (4.41 V) or less. When the voltage at the positive power supply Vcc is 5 V, the resistance value of the resistor R1 is set to 180 kΩ and the resistance value of the resistor R2 is set to 24 kΩ.

The input capture circuit 12 operates according to a timer clock produced by the timer circuit 13, and measures a duty time td1 of the transmission signal SG of the sensor unit 21 and a PWM cycle (communication cycle) tb thereof.

Herein, when the voltage level of the transmission signal SG of the sensor unit 21 is equal to or greater than 3V, the input capture circuit 12 determines that the logic level of the transmission signal SG is a high level. When the voltage level of the transmission signal SG falls below 1 V, the input capture circuit 12 determines that the logic level of the transmission signal SG is a low level.

The frequency of a timer clock of the timer circuit 13 of the ECU 11 is set to 16 MHz, and the timer resolution of the input capture circuit 12 refers to the cycle of the timer clock ($=\frac{1}{16}$ MHz) and therefore comes to 0.0625 μs.

The frequency of a timer clock of the timer circuit 23 of the sensor unit 21 is set to a value equal to or greater than the frequency of the timer clock of the timer circuit 13 of the ECU 11.

The timer resolution (pulse width resolution) of the output comparison circuit 22 refers to the cycle of the timer clock of the timer circuit 23. Therefore, the timer resolution of the output comparison circuit 22 is set to a value equal to or greater than the timer resolution of the input capture circuit 12.

For the transmission signals SG (reference pulses) exhibiting duty cycles of 100% and 0%, respectively, the signal processing circuit 14 produces a duty cycle correction factor k on the basis of the duty times td1 and PWM cycles tb for the duty cycles of 100% and 0%, respectively, which are measured by the input capture circuit 12.

Thereafter, the signal processing circuit 14 produces receiving data D1 on the basis of the duty time td1 and PWM cycle tb, which are measured by the input capture circuit 12, and the duty cycle correction factor k.

Thereafter, the signal processing circuit 14 separates the receiving data D1 into data of a pressure sensor output value of the pressure sensor 24 and data of a temperature sensor output value of the temperature sensor 25.

The ECU 11 then corrects the data of the pressure sensor output value on the basis of the data of the temperature sensor output value, and thus highly precisely implements various controls in the vehicle on the basis of the accurate pressure sensor output value.

Figure 2:
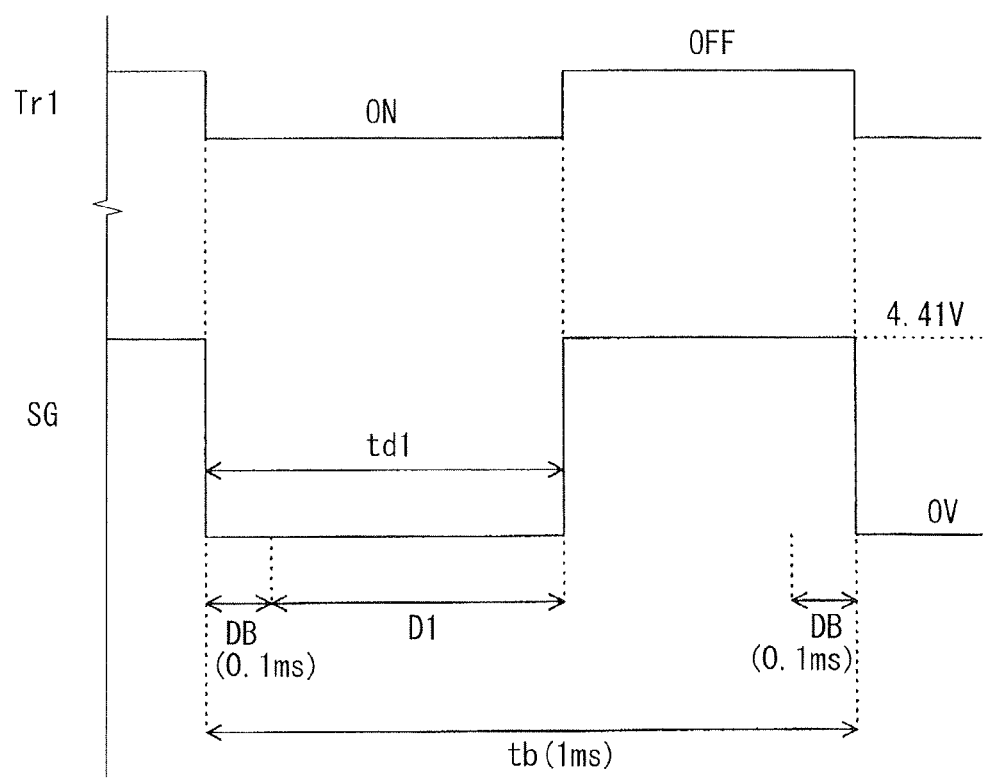
FIG. 2 is a waveform diagram showing a relationship, which is established in the first embodiment, between operations of turning on or off that is performed by a transistor in an output comparison circuit and a transmission signal of a sensor unit.

As shown in FIG. 2, when the transistor Tr1 is turned on, the logic level of the transmission signal SG becomes low (=0 V). When the transistor Tr1 is turned off, the logic level of the transmission signal SG becomes high (=4.41 V).

The PWM cycle tb of the transmission signal SG refers to a one cycle time it takes for the transistor Tr1 to turn on, turn off and then turn on again, and is fixed to 1 ms (predetermined cycle).

The duty time td1 of the transmission signal SG refers to a time within one PWM cycle tb during which the transistor Tr1 remains turned on (time during which the transmission signal SG remains low), and therefore is a variable value.

On a leading side and a railing side of one PWM cycle tb of the transmission signal SG, a dead band (DB) of 0.1 ms long is defined.

Therefore, a time obtained by subtracting the time of the dead band on the leading side from the duty time td1 of the transmission signal SG is equivalent to a duration of receiving data D1.

Since the dead band is defined in the transmission signal SG, when the transmission signal SG exhibits the duty cycle of 100% or 0%, the input capture circuit of the ECU 11 can quickly measure the duty time td1 of the transmission signal SG and the PWM cycle tb thereof.

The time of the dead band may be determined as a design value by obtaining an optimal value on the basis of the balance between the PWM cycle tb and an arithmetic load incurred by the ECU 11.

A relationship shown in FIG. 3A is established in the first embodiment when the transmission signal SG exhibits the duty cycle of 100%, among the transmission signal SG (reference pulse) sent from the sensor unit 21 and the duty time td1 and PWM cycle tb of the transmission signal received by the ECU 11, which are measured by the input capture circuit 12.

Herein, when the transmission signal SG exhibits the duty cycle of 100%, t100d1 denotes the duty time td1 of a receiving signal of the ECU 11 and t100b denotes the PWM cycle tb thereof.

A relationship shown in FIG. 3B is established in the first embodiment when the transmission signal SG exhibits the duty cycle of 0%, among the transmission signal SG (reference pulse) sent from the sensor unit 21 and the duty time td1 and PWM cycle tb of the transmission signal received by the ECU 11, which are measured by the input capture circuit 12.

Herein, when the transmission signal SG exhibits the duty cycle of 0%, t0d1 denotes the duty time td1 of the receiving signal of the ECU 11 and t0b denotes the PWM cycle tb thereof.

The sensor unit 21 is configured to operate as shown in FIG. 4.

When the power supply is turned on and the positive power Vcc is fed, the sensor unit 21 executes pieces of processing of steps described below.

The sensor unit 21 first produces and transmits as a reference pulse the transmission signal SG exhibiting, as shown in FIG. 3A, the duty cycle of 100% (step 101). Thereafter, the sensor unit 21 produces and transmits as the reference pulse the transmission signal SG exhibiting, as shown in FIG. 3B, the duty cycle of 0% (step 102).

The order of executing the processing of step 101 and the processing of step 102 may be reversed.

Thereafter, the sensor unit 21 checks whether the detecting operations of the pressure sensor 24 and temperature sensor 25 are stabilized and both the sensor output values of the respective sensors 24 and 25 are finalized (step 103). When either of the sensor output values of the respective sensors 24 and 25 is not finalized (before finalization), the pieces of processing of steps 101 and 102 are repeatedly executed. When both of the sensor output values of the respective sensors 24 and 25 are finalized (after finalization, the sensor unit 21 performs step 104.

At step 104, the sensor unit 21 repeatedly executes the processing of transmitting the transmission signal SG, which is associated with the sensor output values of the respective sensors 24 and 25, to the ECU 11.

The ECU 11 is configured to perform an input capture (IPC) interrupt processing operation as shown in FIG. 5.

The ECU 11 begins the input capture interrupt processing operation at intervals of a predetermined time, and the input capture circuit 12 and the signal processing circuit 14 execute pieces of processing of steps as follows.

The predetermined time at intervals of which the input capture interrupt processing operation is performed may be determined as a design value by obtaining an optimal value on the basis of an arithmetic load imposed on the ECU 11.

The input capture circuit 12 receives the transmission signal SG of the sensor unit 21, measures and acquires the duty time td1 (step 201), and then measures and acquires the PWM cycle tb of the transmission signal SG (step 202).

The order of executing the processing of step 201 and the processing of step 202 may be reversed.

Thereafter, the signal processing circuit 14 checks whether the duty time td1 obtained through the processing of step 201 is equal to or greater than the duty time t100d1 of the transmission signal SG exhibiting, as shown in FIG. 3A, the duty cycle of 100% (step 203). When the duty time td1 is equal to or greater than the duty time t100d1 (Yes at step 203), the signal processing circuit 14 performs processing of step 204. When the duty time td1 falls below, that is, is less than, the duty time t100d1 (No at step 203), the signal processing circuit 14 performs processing of step 205.

Since a variance occurs in the precision in the duty time td1 due to a difference between the timer resolution of the input capture circuit 12 and the timer resolution of the output comparison circuit 22, the duty time td1 may become equal to or greater than the duty time t100d1.

Therefore, when the duty time td1 is equal to or greater than the duty time t100d1, the duty time td1 can be regarded as the duty time t100d1.

In addition, since a variance occurs in the precision in the PWM cycle tb due to a difference between the timer resolutions of the respective circuits 12 and 22, the PWM cycle tb may be deviated from the fixed value of 1 ms.

Since the variance in the precision of the pulse width (timer precision) between the timer clocks produced by the timer circuits 13 and 23 respectively leads to the difference between the timer resolutions of the respective circuits 12 and 22, the difference between the timer resolutions is regarded as a timer precision difference.

At step 204, the signal processing circuit 14 recognizes the duty time td1, which is obtained through the processing of step 201, as the duty time t100d1, and recognizes the PWM cycle tb, which is obtained through the processing of step 202, as the PWM cycle t100b of the transmission signal SG exhibiting, as shown in FIG. 3A, the duty cycle of 100%.

Herein, since the sensor unit 21 repeatedly transmits the transmission signal SG exhibiting the duty cycle of 100% (processing of step 101 shown in FIG. 4), the ECU 11 can receive the transmission signal SG without fail.

At step 205, the signal processing circuit 14 checks whether the duty time td1 obtained through the processing of step 201 is equal to or less than the duty time t0d1 of the transmission signal SG exhibiting, as shown in FIG. 3B, the duty cycle of 0%. When the duty time td1 is equal to or less than the duty time t0d1 (Yes at step 205), the signal processing circuit 14 performs processing of step 206. When the duty time td1 exceeds the duty time t0d1 (No at step 205), the signal processing circuit 14 performs processing of step 208.

Since a variance occurs in the precision in the duty time td1 due to a difference (timer precision difference) between the timer resolution of the input capture circuit 12 and the timer resolution of the output comparison circuit 22, the duty time td1 may be equal to or less than the duty time t0d1.

Therefore, when the duty time td1 is equal to or less than the duty time t0d1, the duty time td1 may be regarded as the duty time t0d1.

Therefore, at step 206, the signal processing circuit 14 recognizes the duty time td1, which is obtained through the processing of step 201, as the duty time t0d1, and recognizes the PWM cycle tb, which is obtained through the processing of step 202, as the PWM cycle t0b of the transmission signal SG exhibiting, as shown in FIG. 3B, the duty cycle of 0%.

Herein, since the sensor unit 21 repeatedly transmits the transmission signal SG exhibiting the duty cycle of 0% (processing of step 102 shown in FIG. 4), the ECU 11 can receive the transmission signal SG without fail.

Thereafter, the signal processing circuit 14 calculates the duty cycle correction factor k according to the equation (1), which is presented below, on the basis of the duty times t100d1 and t0d1 and the PWM cycles t100b and t0b which are recognized through the pieces of processing of steps 204 and 205 (step 207).

Herein, 0.8 in the equation 1 is a value obtained by subtracting the time of the dead band (=0.1 ms) on the leading side or trailing side from the time of the PWM cycle tb (=1 ms).

The order of executing the pieces of processing of steps 203 and 204 or steps 205 and 206 may be reversed.

$$k=0.8/(t100d1 \times t100b - t0d1 \times t0b) \quad (1)$$

At step 208, the signal processing circuit 14 calculates the receiving data D1 (ms) according to the equation (2), which is presented below, on the basis of the duty time td1 obtained through the processing of step 201, the PWM cycle tb obtained through the processing of step 202, and the duty cycle correction factor k obtained through the processing of step 207.

Herein, 0.1 in the equation (2) is a value representing the time of the dead band on the leading side within the PWM cycle tb.

After executing the processing of step 208, the ECU 11 terminates the input capture interrupt processing operation.

$$D1 = k \times td1 \times tb - 0.1 \quad (2)$$

The signal processing circuit 26 of the sensor unit 21 performs signal processing as shown in FIG. 6A and FIG. 6B during the processing of step 104 shown in FIG. 4.

In FIG. 6A and FIG. 6B, bits forming a digital signal (data) of a temperature sensor output value are indicated with bold-faced squares.

As shown in FIG. 6A, the signal processing circuit 26 produces data of 10 bits long by analog-to-digitally converting a pressure sensor output value of the pressure sensor 24, and produces data of 6 bits long by analog-to-digitally converting a temperature sensor output value of the temperature sensor 25.

The signal processing circuit 26 then uses a dithering method to append ±1 least significant bit (LSB) as a dither to the least significant bit (sixth bit) of data of the temperature sensor output value so as to perform dithering. Thus, a dithering effect is obtained.

Herein, the frequency of a timer clock of the timer circuit 13 of the ECU 11 is set to 16 MHz, and the timer resolution of the input capture circuit 12 corresponds to the cycle of the timer clock (=1/16 MHz) and therefore corresponds to 0.0625 µs.

Namely, the data length of the 1 LSB of the receiving data D1 shown in FIG. 2 corresponds to 0.0625 µs.

As shown in FIG. 2, FIG. 3A and FIG. 3B, the PWM cycle tb of the transmission signal SG is fixed to 1 ms.

Therefore, as long as the transmission signal SG of the sensor unit 21 is 14 bits long, the input capture circuit 12 of the ECU 11 can receive the transmission signal without fail. There is a possibility that the input capture circuit 12 can receive two other bits in addition to the 14 bits. Therefore, there is a possibility that the input capture circuit 12 can receive a total of 16 bits.

Therefore, the signal processing circuit 26 of the sensor unit 21 represents a pressure sensor output value with data of 10 bits long and a temperature sensor output value with data of 6 bits long so that the transmission signal SG becomes 16 bits long.

The number of bits forming data of the temperature sensor output value or a pressure sensor output value is set to the foregoing value lies, for the reason that the temperature sensor output value is used to correct the pressure sensor output value. As long as the data of the temperature sensor output value is 6 bits long, 10 bits forming the data of the pressure sensor output value can be reliably corrected.

As shown in FIG. 6B, the signal processing circuit 26 multiplexes the 10-bit data of the pressure sensor output value and the 6-bit data of the temperature sensor output value and compressing the resultant data, and thus produces compressed data having the data items compressed thereto.

The characteristics of the sensors 24 and 25 are such that the temperature sensor output value of the temperature sensor 25 does not vary abruptly in comparison with a degree of a change in the pressure sensor output value of the pressure sensor 24.

In addition, the temperature sensor output value is used to correct the pressure sensor output value, and the importance of the temperature sensor output value is lower than that of the pressure sensor output value.

The transmission signal SG capable of being received by the input capture circuit 12 of the ECU 11 without fail is 14 bits long.

Further, it is likely that an error may occur in the transmission signal SG, which the input capture circuit 12 receives, due to a difference (timer precision difference) between the timer resolution of the input capture circuit 12 of the ECU 11 and the timer resolution of the output comparison circuit 22 of the sensor unit 21. Therefore, it is necessary to avoid an adverse effect of the timer precision difference.

Bits on the LSB sides of the respective data items of the pressure sensor output value and temperature sensor output value are collectively arranged on the LSB side of the compressed data, that is, the LSB and nearby bits of the data of the temperature sensor output value are allocated as the LSB and nearby bits of the compressed data.

More particularly, as shown in FIG. 6B, two least significant bits (low-order bits) of data of a temperature sensor output value is allocated as two least significant bits (fifteenth and sixteenth bits from the most significant bit, that is from the highest-order) of compressed data.

Seven high-order bits of data of a pressure sensor output value are allocated as seven high-order bits (first to seventh bits) of the compressed data.

One bit of the data of the temperature sensor output value and one bit of the data of the pressure sensor output value are alternately allocated as the eighth to fourteenth bits of the compressed data.

Since a dither is appended to the least significant bit of the data of the temperature sensor output value, the dither is appended to the least significant bit (sixteenth bit) of the compressed data.

The signal processing circuit 14 of the ECU 11 performs operations shown in FIG. 7A to FIG. 7D during the processing of step 208 in FIG. 5.

In FIG. 7A to FIG. 7D, bits forming data of a temperature sensor output value are indicated with boldfaced squares.

As shown in FIG. 7A, the signal processing circuit 14 appends data of 18 bits long, which is equivalent to 0.5 LSB, to data of 14 bits long that has a duty time td1 and is obtained through the processing of step 201 shown in FIG. 5, so as to extend the data of 14 bits long, and thus produces data of 32 bits long.

Herein, the data having the duty time td1 is 14 bits long, because the input capture circuit 12 of the ECU 11 can receive the transmission signal SG of 14 bits long without fail.

In addition, because the microcomputer included in the ECU 11 operates in a 32-bit architecture, the data having the duty time td1 is extended to have 32 bits.

As shown in FIG. 7B, the signal processing circuit 14 calculates the receiving data D1 according to the equation (2) on the basis of the duty time td1 extended to the length of 32 bits, the PWM cycle tb obtained through the processing of step 202 shown in FIG. 5, and the duty cycle correction factor k obtained through the processing of step 207 shown in FIG. 5.

Since the duty time td1 is extended to the length of 32 bits, the receiving data D1 becomes 32 bits long.

Herein, the receiving data D1 has a bit structure that data of 16 least significant bits is appended to the tail end of data of 16 bits long that conforms to the same bit assignment rule as the compressed data shown in FIG. 6B does.

As shown in FIG. 7C, the receiving data D1 is separated based on the bit assignment rule, to which the compressed data conforms, in order to produce data of a pressure sensor output value of the pressure sensor 24 and data of a temperature sensor output value of the temperature sensor 25.

The data of the pressure sensor output value separated from the receiving data D1 has nearly the same bit structure as the data of the pressure sensor output value shown in FIG. 6A does, and includes 10 bits.

The data of the temperature sensor output value separated from the receiving data D1 has a bit structure of a total of 22 bits. Namely, data of 16 least significant bits is appended to the tail end of data of 6 bits long which has nearly the same bit structure as the data of the temperature sensor output value shown in FIG. 6A.

As shown in FIG. 6A, the signal processing circuit 26 of the sensor unit 21 appends as a dither ±1 LSB to the least significant bit (sixth bit) of the data of the temperature sensor output value.

Therefore, a fluctuation deriving from the dithering effect is contained in the 18 least significant bits of the data of the temperature sensor output value separated from the receiving data D1.

As shown in FIG. 7C, the signal processing circuit 14 performs low-pass filter processing to apply a low-pass filter, which is a digital filter, to the data of the temperature sensor output value, and thus samples and finalizes two bits from among the 18 least significant bits of the data of the temperature sensor output value.

As a result, as shown in FIG. 7D, 6-bit data having nearly the same bit structure as the temperature sensor output value shown in FIG. 6A does is obtained.

Operation and Advantage of the First Embodiment

According to the PWM communication system 10 of the first embodiment, an operation and advantage described below are provided.

[1] The sensor unit 21 produces and transmits as reference pulses the transmission signals SG, which exhibit duty cycles of 100% and 0%, respectively, prior to transmission of the transmission signal SG based on a digital signal having data items compressed thereinto by the signal processing circuit 26.

The input capture circuit 12 of the ECU 11 measures the duty time td1 and PWM cycle tb of the transmission signal SG according to a timer clock produced by the timer circuit 13.

The signal processing circuit 14 of the ECU 11 produces the duty cycle correction factor k on the basis of the duty times t100d1 and t0d1 of the reference pulses (transmission signals SG exhibiting the duty cycles of 100% and 0%, respectively) and the PWM cycles t100b and t0b thereof, which are measured by the input capture circuit 12. The signal processing circuit 14 produces the receiving data D1 on the basis of the duty time td1 and PWM cycle tb of the transmission signal SG, which are measured by the input capture circuit 12, and the duty cycle correction factor k, and separates the receiving data D1 into the sensor output value of the pressure sensor 24 and the sensor output value of the temperature sensor 24, which are represented by digital signals existent before being multiplexed by the signal processing circuit 26.

That is, the PWM cycle tb of the transmission signal SG is fixed to a predetermined cycle (=1 ms) at every transmission of the transmission signal SG based on a digital signal having data items compressed by the signal processing circuit 26. The signal processing circuit 14 compensates for a variation from the fixed value using the duty cycle correction factor k. Thus, the timer resolutions of the sensor unit 21 and ECU 11 are corrected, and the precision in the duty time td1 is compensated at each transmission of the transmission signal SG.

The timer circuit 13 of the ECU 11 and the timer circuit 23 of the sensor unit 21 have a difference in a timer resolution within a specification tolerance. The ratio of times equivalent to 1 LSB in the timer circuits 13 and 23 is reflected not only on the duty time td1 of the transmission signal SG but also on the PWM cycle tb thereof.

Therefore, in the ECU 11, the PWM cycle tb is fixed to the predetermined cycle (=1 ms), and the duty time td1 is corrected at every receiving of the transmission signal SG.

Accordingly, even when the timer clock of the timer circuit 23. based on which the output comparison circuit 22 produces the transmission signal SG, varies from a design value, the ECU 11 can acquire the correct duty time td1 of the transmission signal SG.

Therefore, since the timer precision of the timer circuit 23 may be low, the timer circuit 23 may be formed with an inexpensive circuit in order to reduce costs.

The ECU 11 and sensor unit 21 are not formed using special circuits.

Therefore, the PWM communication system capable of highly precisely performing multiplex communication can be provided at the low cost.

[2] The signal processing circuit 26 of the sensor unit 21 collectively arranges bits on the LSB sides of data items of the pressure sensor output value and temperature sensor output value respectively on the LSB side of compressed data, and assigns the LSB and nearby bits of the data of the temperature sensor as the LSB and nearby bits of the compressed data (FIG. 6B).

Therefore, in the first embodiment, the important high-order bits of the compressed data are least susceptible to a noise. In addition, since even when one of the pressure sensor output value and temperature sensor output value varies greatly, the variation is dispersed to the bits of the compressed data. Therefore, accurate compressed data can be produced.

[3] The signal processing circuit 26 of the sensor unit 21 appends as a dither ±1 LSB to the least significant bit of data (digital signal) of a temperature sensor output value which corresponds to the least significant bit of compressed data, and multiplexes a pressure sensor output value and the temperature sensor output value (FIG. 6).

The signal processing circuit 14 of the ECU 11 applies a low-pass filter, which is a digital filter, to the data of the temperature sensor output value, to which the dither is appended, out of the data items of the pressure sensor output value and temperature sensor output value that are separated from each other, and thus finalizes the least significant bits of the data of the temperature sensor output value (FIG. 7C and FIG. 7D).

Therefore, in the first embodiment, a dithering method is adopted in order to make the timer resolution of the output comparison circuit 22 of the sensor unit 21 equal to or greater than the timer resolution of the input capture circuit 12 of the ECU 11. The precision in PWM communication equal to or higher than that associated with the timer resolution of the input capture circuit 12 of the ECU 11 can be attained.

Second Embodiment

Figure 8:
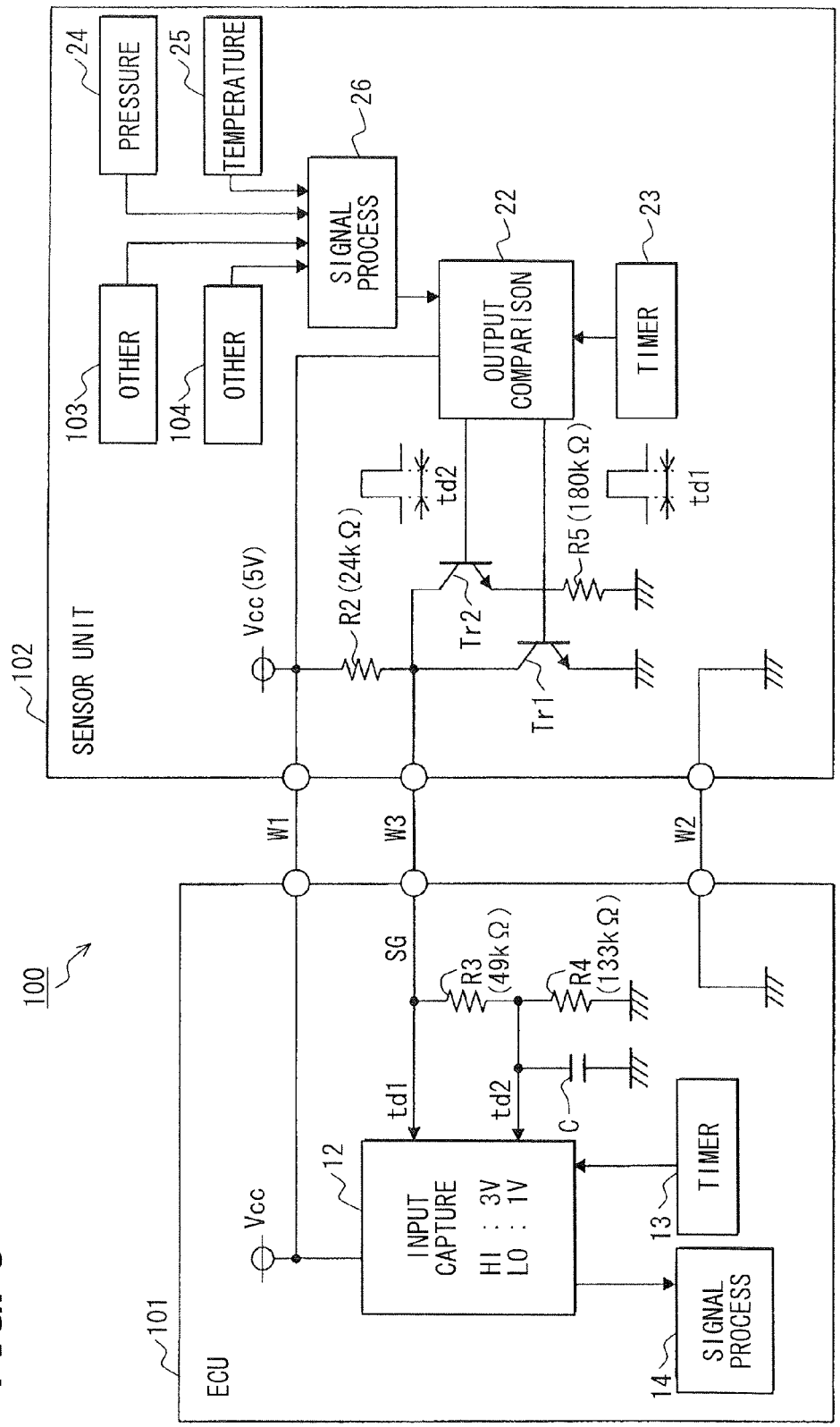
FIG. 8 is a block circuit diagram showing an entire configuration of a PWM communication system in accordance with a second embodiment of the present invention.

Referring to FIG. 8, a PWM communication system 100 of a second embodiment includes an ECU 101, a sensor unit 102, and wiring harnesses W1 to W3 that link the ECU 101 and sensor unit 102, and is mounted in a vehicle.

The sensor unit 102 includes an output comparison circuit 22, a timer circuit 23, npn transistors Tr1 and Tr2, resistors R2 and R5, a pressure sensor 24, a temperature sensor 25, a signal processing circuit 26, and other sensors 103 and 104. The four sensors 24, 25, 103 and 104 are integrated.

The sensor 103 detects an appropriate object of detection of the vehicle (for example, an illuminance or an inclination of the vehicle), and produces a sensor output value of an analog value proportional to the result of the detection.

The sensor 104 detects an object of detection for use in correcting the sensor output value of the sensor 103, and produces a sensor output value of an analog signal proportional to the result of the detection.

The relationship between the sensors 103 and 104 is equivalent to the relationship between the sensors 24 and 25.

The signal processing circuit 26 converts, similarly to that in the first embodiment, the sensor output values of the respective sensors 24 and 25 into digital signals, multiplexes the digital signals of the sensor output values, and produces a digital signal of one data having the data items compressed thereinto.

The signal processing circuit 26 converts the sensor output values of the respective sensors 103 and 104 into digital signals, multiplexes the digital signals of the sensor output values, and produces a digital signal of one data having the data items compressed thereinto.

The output comparison circuit 22 operates, similarly to that in the first embodiment, according to a timer clock produced by the timer circuit 23.

The output comparison circuit 22 produces, similarly to that in the first embodiment, a first PWM signal, which has a duty time td1, on the basis of the digital signal representing the sensor output values of the respective sensors 24 and 25 and being produced by the signal processing circuit 26, and applies the PWM signal to the gate of the transistor Tr1.

The output comparison circuit 22 also produces a second PWM signal, which has a duty time td2, on the basis of the digital signal representing the sensor output values of the respective sensors 103 and 104 and being produced by the signal processing circuit 26, and applies the PWM signals to the gate of the transistor Tr2.

The emitter of the transistor Tr2 is grounded via the resistor R5, and the collector thereof is connected to a positive power supply Vcc via the resistor R2. The collector of the transistor Tr2 is connected to the collector of the transistor Tr1.

Therefore, a PWM signal exhibiting a reverse of a logic level of the PWM signal outputted from the output comparison circuit 22 is transmitted as a transmission signal SG of the sensor unit 102 from the collector of each of the transistors Tr1 and Tr2.

The ECU 101 includes an input capture circuit 12, a timer circuit 13, a signal processing circuit 14, a capacitor C, and resistors R3 and R4.

The transmission signal SG of the sensor unit 102 is transmitted to the ECU 101 over the wiring harness W3.

The input capture circuit 12 of the ECU 101 receives the transmission signal SG sent over the wiring harness W3.

Therefore, the transmission signal SG of the sensor unit 102 becomes a receiving signal of the ECU 101.

The input capture circuit 12 includes two input ports for the duty times td1 and td2 respectively.

The resistors R3 and R4 are connected in series with each other between the td1 input port of the input capture circuit 12 and the ground.

The capacitor C and resistor R4 are connected in parallel with each other between the td2 input port of the input capture circuit 12 and the ground.

The transmission signal SG received by the ECU 101 is directly inputted to the td1 input port of the input capture circuit 12.

The transmission signal SG received by the ECU 101 is inputted to the td2 input port of the input capture circuit 12 via the resistor R3.

The input capture circuit 12 operates according to a timer clock produced by the timer circuit 13, and measures the duty time td1 or td2 of the transmission signal SG of the sensor unit 102 and the PWM cycle tb thereof.

For the transmission signals SG that exhibit duty cycles of 100% and 0% respectively, the signal processing circuit 14 produces a duty cycle correction factor k on the basis of the duty times td1 and td2 for the duty cycles of 100% and 0% and the PWM cycle tb therefor which are measured by the input capture circuit 13.

Thereafter, the signal processing circuit 14 calculates, similarly to that in the first embodiment, receiving data D1 of the sensor output values of the respective sensors 24 and 25 on the basis of the duty time td1, PWM cycle tb, and duty cycle correction factor k, and separates the receiving data D1 into data items of the sensor output values of the respective sensors 24 and 25.

The signal processing circuit 14 calculates receiving data D2 (ms) of the sensor output values of the sensors 103 and 104 on the basis of a predefined function f(td1) of the duty time td1 and the duty time td2.

Thereafter, the signal processing circuit 14 separates the receiving data D2 into data items of the sensor output values of the respective sensors 103 and 104.

The ECU 101 corrects the data of the sensor output value of the sensor 103 on the basis of the data of the sensor output value of the sensor 104, and thus highly precisely implements various controls in the vehicle on the basis of the accurate sensor output value of the sensor 103.

Figure 9:
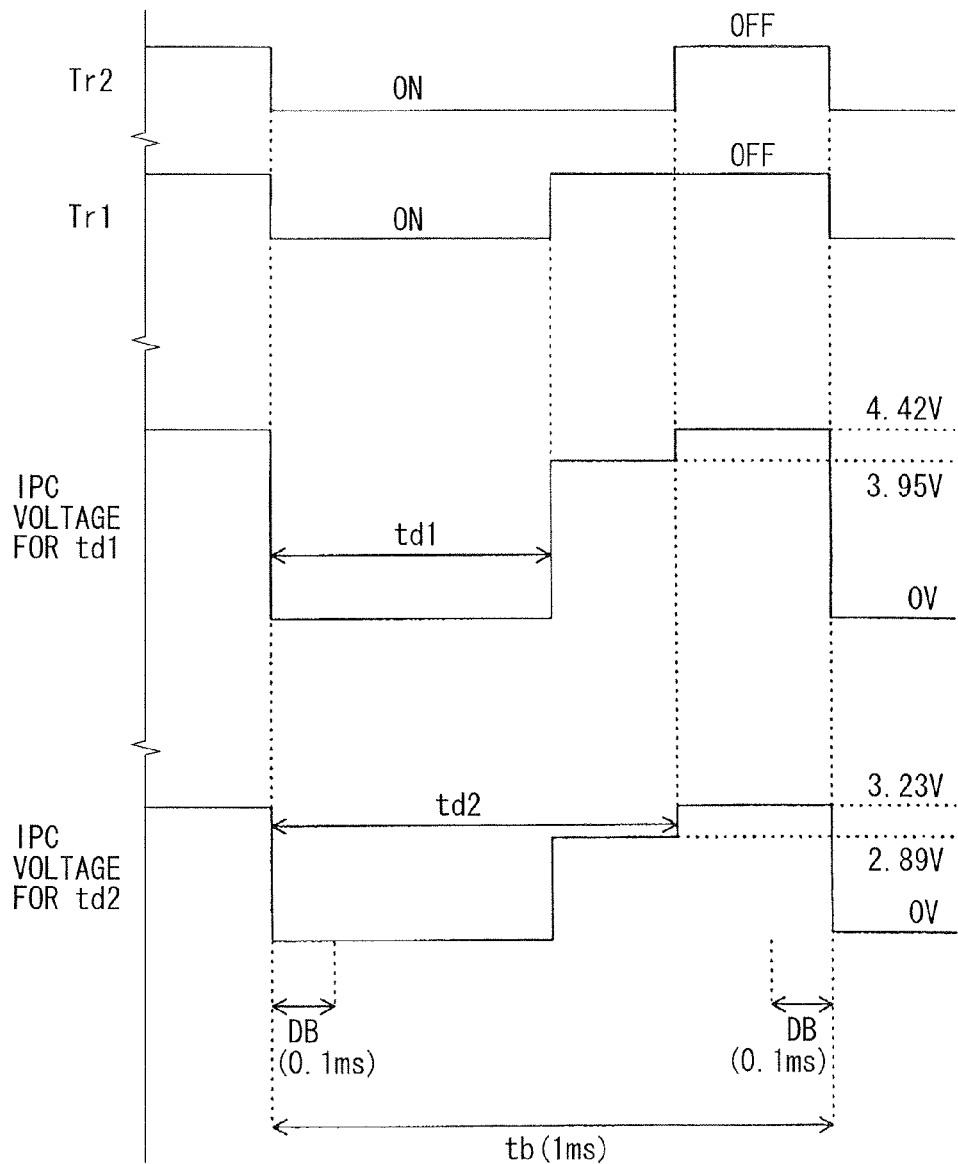
FIG. 9 is a waveform diagram showing a relationship, which is established in the second embodiment, among operations of turning on or off that is performed by a transistor in an output comparison circuit, an input voltage at a td1 input port of an input capture circuit included in an ECU, and an input voltage at a td2 input port of the input capture circuit.

A relationship shown in FIG. 9 is established in the second embodiment, among operations of turning on or off of the transistors Tr1 and Tr2 of the output comparison circuit 22, an input voltage at the td1 input port of the input capture circuit 12 of the ECU 101 (hereinafter, a td1 input capture voltage), and an input voltage at the td2 input port of the input capture circuit 12 (hereinafter, a td2 input capture voltage).

Herein, the resistors R2 to R5 are included to set the td1 input capture voltage and td2 input capture voltage to voltage values shown in FIG. 9. When the voltage at the positive power supply Vcc is 5 V, the resistance value of the resistor R2 is set to 24 kΩ, the resistance value of the resistor R3 is set to 49 kΩ, the resistance value of the resistor R4 is set to 133 kΩ, and the resistance value of the resistor R5 is set to 180 kΩ.

When the transistors Tr1 and Tr2 turn on, both the td1 and td2 input capture voltages become 0 V.

When the transistor Tr2 remains turned on, if the transistor Tr1 becomes OFF, the td1 input capture voltage becomes 3.95 V and the td2 input capture voltage becomes 2.89 V.

When both the transistors Tr1 and Tr2 turn off, the td1 input capture voltage becomes 4.42 V and the td2 input capture voltage becomes 3.23 V.

The PWM cycle tb of the transmission signal SG refers to a time it takes for the transistors Tr1 and Tr2 turn on, turn off, and then turn on again, and is fixed to 1 ms.

The duty time td1 of the transmission signal SG refers to a time within one PWM cycle tb, during which the transistor Tr1 remains turned on, and is a variable value.

The duty time td2 of the transmission signal SG refers to a time within one PWM cycle tb during which the transistor Tr2 remains turned on, and is a variable value.

Each of the duty times td1 and td2 is determined with the start timing thereof made coincident with a leading (beginning) edge of the input capture voltage within one PWM cycle tb thereof so that the duty time td1 becomes equal to or less than the duty time td2 (td1≦td2).

Therefore, as seen from the equation (3) below, the duty time td2 can be expressed with the receiving data D2 and function f(td1).

In short, the function f(td1) of the duty time td1 is regarded as an offset value and determined so that the duty time td2 can be expressed as the sum of the receiving data D2 and function f(td1).

Herein, the function f(td1) has to be determined to be equal to or less than the duty time td1 (f(td1)≦td1).

$$td2 = D2 + f(td1) \qquad (3)$$

Based on the function f(td1) of the duty time td1 and the duty time td2, the signal processing circuit 14 calculates the receiving data D2 according to the equation (4) below.

$$D2 = td2 - f(td1) \qquad (4)$$

Operation and Advantage of the Second Embodiment

In the PWM communication system 100 of the second embodiment, the signal level of the transmission signal SG is temporally varied in two steps, and the duty times td1 and td2 are associated with the stepped temporal variations respectively of the signal level. Thus, the two duty times td1 and td2 can be convoluted into the one transmission signal SG.

Therefore, in the second embodiment, the data items of the sensor output values of the respective sensors 24 and 25 can be transmitted or received based on the duty time td1, and the data items of the sensor output values of the respective sensors 103 and 104 can be transmitted or received based on the duty time td2. Eventually, the data items of the four sensor output values in total can be subjected to PWM communication merely using the one transmission signal SG.

Third Embodiment

Figure 10:
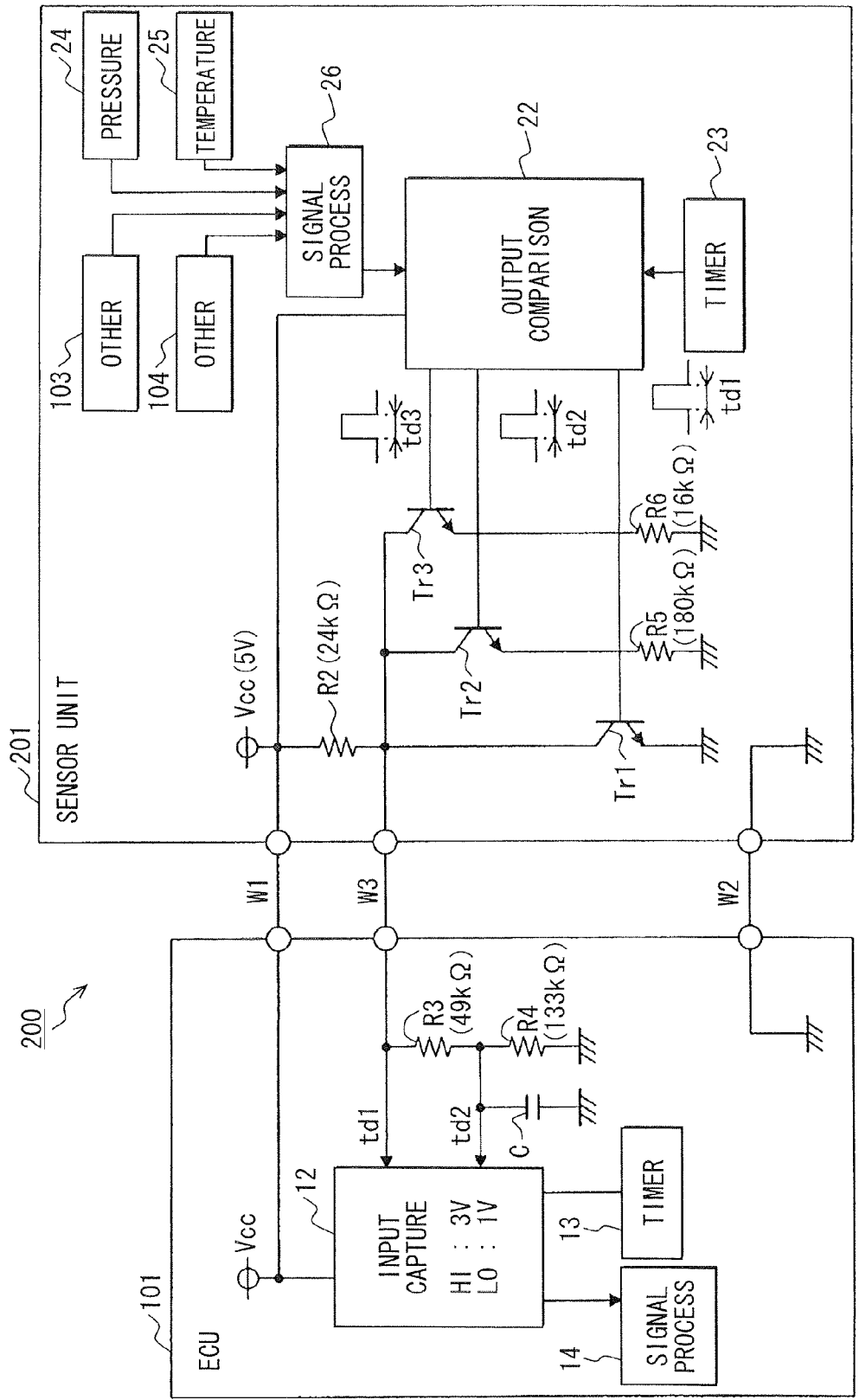
FIG. 10 is a block circuit diagram showing an entire configuration of a PWM communication system in accordance with a third embodiment of the present invention.

Referring to FIG. 10, a PWM communication system 200 in accordance with a third embodiment includes an ECU 101, a sensor unit 201, and wiring harnesses W1 to W3 that link the ECU 101 and sensor unit 201, and is mounted in a vehicle.

The sensor unit 201 includes an output comparison circuit 22, a timer circuit 23, npn transistors Tr1, Tr2 and Tr3, resistors R2, R5 and R6, a pressure sensor 24, a temperature sensor 25, a signal processing circuit 26, and other sensors 103 and 104. The four sensors 24, 25, 103 and 104 are integrated.

The output comparison circuit 22 operates, similarly to that in the first embodiment, according to a timer clock produced by the timer circuit 23.

The output comparison circuit 22 then produces a first PWM signal, which has a duty time td1, on the basis of a digital signal representing the sensor output values of the respective sensors 24 and 25 and being produced by the signal processing circuit 26, and applies the PWM signal to the gate of the transistor Tr1.

Further, the output comparison circuit 22 produces a second PWM signal, which has a duty time td2, on the basis of a digital signal representing the sensor output values of the respective sensors 103 and 104 and being produced by the signal processing circuit 26, and applies the PWM signal to the gate of the transistor Tr2.

In addition, the output comparison circuit 22 produces a third PWM signal, which has a duty time td3, on the basis of a digital signal representing the sensor output values of the respective sensors 24, 25, 103 and 104 and being produced by the signal processing circuit 26, and applies the PWM signal to the gate of the transistor Tr3.

The emitter of the transistor Tr3 is grounded via the resistor R6, and the collector thereof is connected to a positive power supply Vcc via the resistor R2. That is, the collector of the transistor Tr3 is connected to the collectors of the transistors Tr1 and Tr2, respectively.

Therefore, a PWM signal exhibiting a reverse of a logic level of the PWM signal outputted from the output comparison circuit 22 is transmitted as a transmission signal SG of the sensor unit 201 from the collector of each of the transistors Tr1 to Tr3.

The transmission signal SG of the sensor unit 201 is transmitted to the ECU 101 over the wiring harness W3.

The input capture circuit 12 of the ECU 101 receives the transmission signal SG sent over the wiring harness W3.

Therefore, the transmission signal SG of the sensor unit 201 becomes a receiving signal of the ECU 101.

The ECU 101 calculates, similarly to that in the second embodiment, receiving data D1 of the sensor output values of the respective sensors 24 and 25, and separates the receiving data D1 into data items of the sensor output values of the respective sensors 24 and 25. In addition, the ECU 101 calculates receiving data D2 of the sensor output values of the respective sensors 103 and 104, and separates the receiving data D2 into data items of the sensor output values of the respective sensors 103 and 104.

Figure 11:
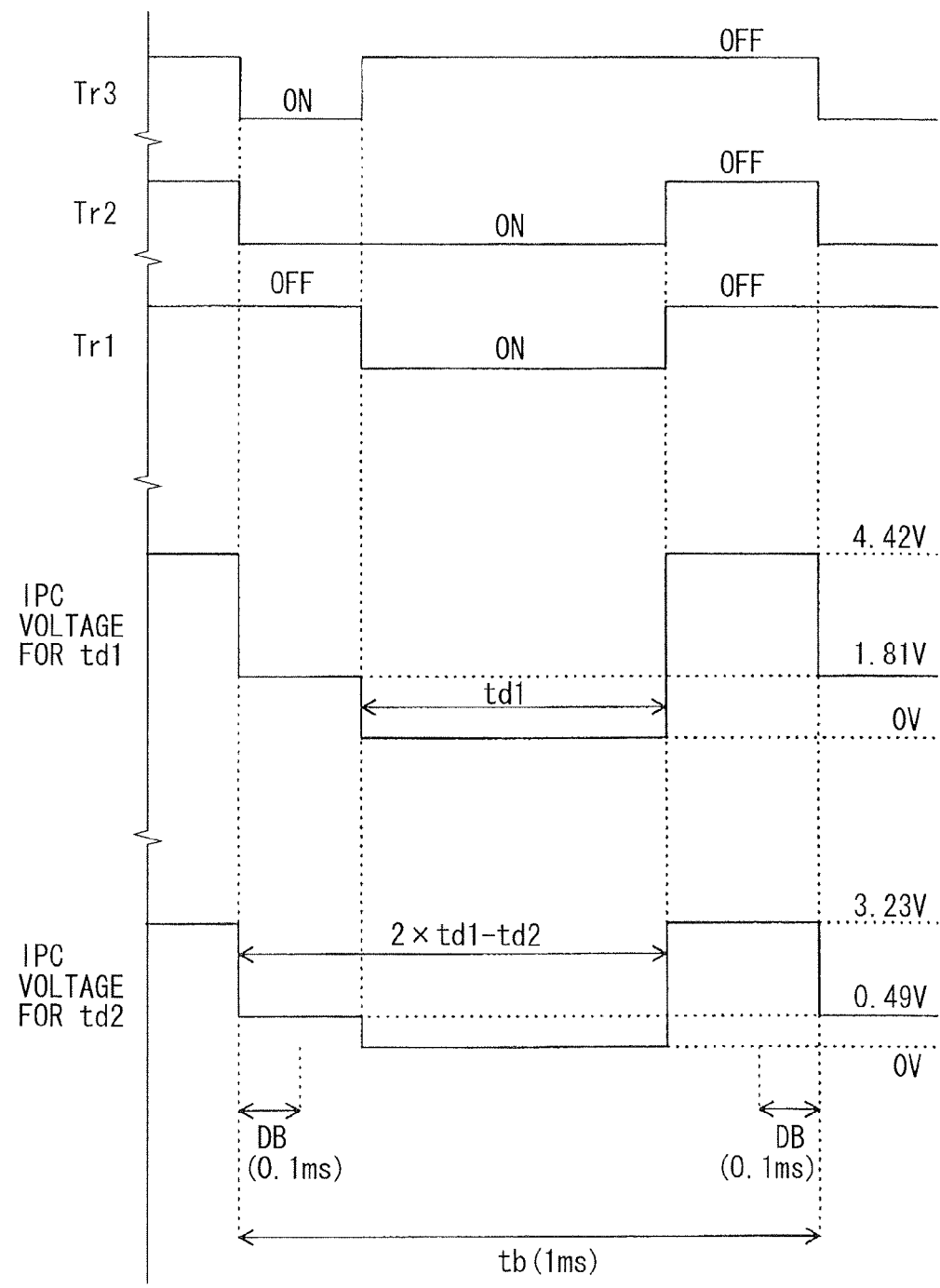
FIG. 11 is a waveform diagram showing a relationship, which is established in the third embodiment, among operations of turning on or off that are performed by transistors and respectively in an output comparison circuit, an input voltage at a td1 input port of an input capture circuit included in an ECU, an input voltage at a td2 input port of the input capture circuit.

A relationship shown in FIG. 11 is established in the third embodiment, among operations of turning on or off of the transistors Tr1 and Tr2 of the output comparison circuit 22, an input voltage at a td1 input port of the input capture circuit 12 of the ECU 101 (td1 input capture voltage), and an input voltage at a td2 input port of the input capture circuit 12 (td2 input capture voltage).

Herein, the resistors R2 to R6 are included so that the td1 and td2 input capture voltages take voltage values shown in FIG. 11. When the voltage at the positive power supply Vcc is 5 V, the resistance value of the resistor R2 is set to 24 kΩ, the resistance value of the resistor R3 is set to 49 kΩ, the resistance value of the resistor R4 is set to 133 kΩ, the resistance value of the resistor R5 is set to 180 kΩ, and the resistance value of the resistor R6 is set to 16 kΩ.

When the transistor Tr1 turns off and the transistors Tr2 and Tr3 turn on, the td1 input capture voltage is 1.81 V and the td2 input capture voltage is 0.49 V.

When the transistor Tr2 remains turned on, if the transistor Tr1 turns on and the transistor Tr3 turns off, the td1 and td2 input capture voltages is 0 V.

When all the transistors Tr1 to Tr3 turn off, the td1 input capture voltage is 4.42 V and the td2 input capture voltage is 3.23 V.

The PWM cycle tb of the transmission signal SG refers to a time it takes for the transistors Tr2 and Tr3 to turn on, turn off, and then turn on again, and is fixed to 1 ms.

The duty time td1 of the transmission signal SG refers to a time within one PWM cycle tb during which the transistor Tr1 remains turned on, and is a variable value.

As seen from the equation (5) below, a time Q within one PWM cycle tb during which the transistor Tr2 remains turned on is expressed with the duty times td1 and td2.

$$Q = 2 \times td1 - td2 \quad (5)$$

Based on the time Q and duty time td1, the signal processing circuit 14 calculates the duty time td2 according to the equation (6) below.

$$td2 = 2 \times td1 - Q \quad (6)$$

Operation and Advantage of the Third Embodiment

According to the third embodiment, the same operation and advantage as those of the second embodiment are provided.

In addition, according to the third embodiment, a case where the duty time td1 exceeds the duty time td2 (td1>td2) can be coped with.

Further, according to the third embodiment, since the transistor Tr3 is included, when the transistor Tr1 is turned off and the transistors Tr2 and Tr3 are turned on, the td2 input capture voltage is 0.49 V. The td2 input capture voltage can be set to a voltage equal to or less than a threshold voltage (=1 V) based on which the input capture circuit 12 checks whether the logic level of the transmission signal SG is a low level.

Fourth Embodiment

A PWM communication system 300 in accordance with a fourth embodiment is identical to that of the PWM communication system 10 in accordance with the first embodiment shown in FIG. 1.

Figure 12:
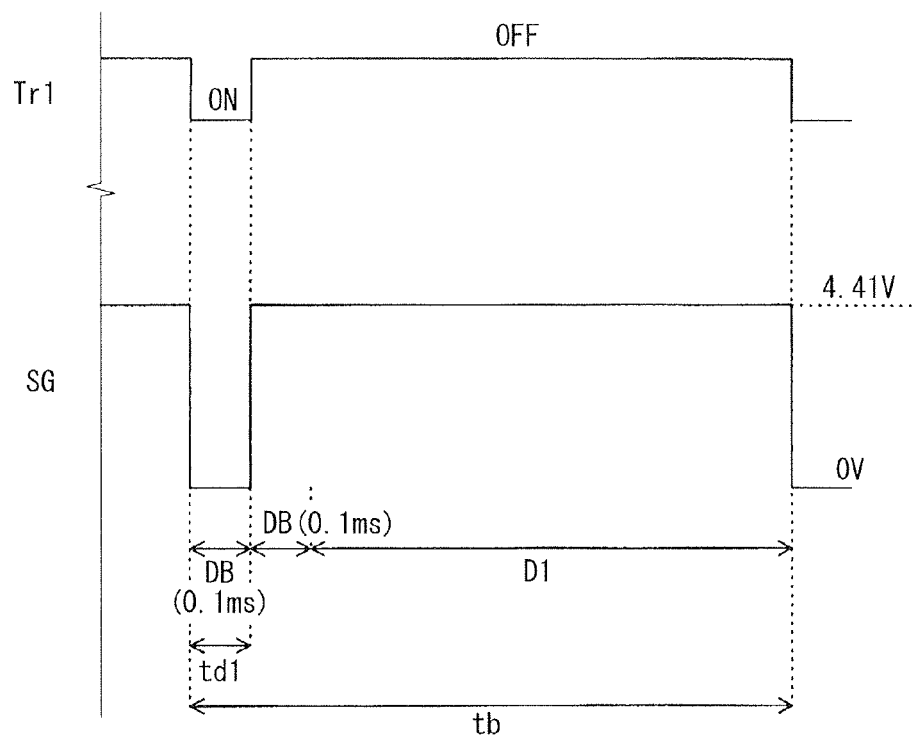
FIG. 12 is a waveform diagram showing a relationship, which is established in the fourth embodiment, between operations of turning on or off that is performed by a transistor in an output comparison circuit and a transmission signal of a sensor unit.

A relationship shown in FIG. 12 is established as shown in FIG. 12 in the fourth embodiment, between operations of turning on or off of the transistor Tr1 of the output comparison circuit 22 and a transmission signal SG of the sensor unit 21 (input voltage of the input capture circuit 12 of the ECU 11).

When the transistor Tr1 is turned on, the logic level of the transmission signal SG is a low level (=0 V). When the transistor Tr1 is turned off, the logic level of the transmission signal SG is a high level (=4.41 V).

The PWM cycle tb of the transmission signal SG refers to a time it takes for the transistor Tr1 to turn on, turn off, and then turn on again, and is a variable value equal to or less than 1 ms.

The duty time td1 of the transmission signal SG refers to a time within one PWM cycle tb during which the transistor Tr1 remains turned on (time during which the transmission signal SG remains low), and is fixed to 0.1 ms (predetermined time).

On the leading side of the transmission signal SG within one PWM cycle tb thereof, two dead bands each of which is 0.1 ms long are successively defined.

Therefore, a time obtained by subtracting the time equivalent to the two dead bands (=0.2 ms) from the PWM cycle tb of the transmission signal SG refers to the duration of receiving data D1.

Since the dead bands are defined for the transmission signal SG, when the transmission signal SG exhibits a duty cycle of 100% or 0%, the input capture circuit 12 of the ECE 11 can quickly measure the duty time td1 and PWM cycle tb of the transmission signal SG.

A relationship shown in FIG. 13A is established in the fourth embodiment when the transmission signal SG exhibits the duty cycle of 100%, among the transmission signal SG (reference pulse) sent from the sensor unit 21, and the duty time td1 and PWM cycle tb of the transmission signal received by the ECU 11 which are measured by the input capture circuit 12.

Herein, when the transmission signal SG exhibits the duty cycle of 100%, t100d1 denotes the duty time td1 of the receiving signal of the ECU 11 and t100b denotes the PWM cycle tb thereof.

When the transmission signal SG exhibits the duty cycle of 100%, the PWM cycle t100b is set to 1 ms.

A relationship shown in FIG. 13B is established in the fourth embodiment when the transmission signal SG exhibits the duty cycle of 0%, among the transmission signal SG (reference pulse) sent from the sensor unit 21 and the duty time td1 and PWM cycle tb of the transmission signal received by the ECU 11 which are measured by the input capture circuit 12.

Herein, when the transmission signal SG exhibits the duty cycle of 0%, t0d1 denotes the duty time td1 of the receiving signal of the ECU 11 and t0b denotes the PWM cycle tb thereof.

When the transmission signal SG exhibits the duty cycle of 0%, the PWM cycle t0b is set to 0.2 ms.

The sensor unit 21 in the fourth embodiment is configured to operate as shown in FIG. 14.

After the power supply is turned on, when a positive power Vcc is fed to the sensor unit 21, the sensor unit 21 executes pieces of processing of steps described below.

First, the sensor unit 21 produces and transmits as a reference pulse the transmission signal SG exhibiting, as shown in FIG. 13A, the duty cycle of 100% (step 301). Thereafter, the sensor unit 21 produces and transmits as a reference pulse the transmission signal SG exhibiting, as shown in FIG. 13B, the duty cycle of 0% (step 302).

The order of executing the processing of step 301 and the processing of step 302 may be reversed.

Thereafter, the sensor unit 21 checks whether the detecting operations of the pressure sensor 24 and temperature sensor 25 respectively are stabilized and the sensor output values of the respective sensors 24 and 25 are finalized (step 303). When either of the sensor output values of the respective sensors 24 and 25 is not finalized (before finalization), the pieces of processing of steps 301 and 302 are repeatedly executed. When both the sensor output values of the respective sensors 24 and 25 are finalized (after finalization), the sensor unit 21 executes the processing of step 304.

At step 304, the sensor unit 21 repeatedly executes the processing of transmitting the transmission signal SG, which is associated with the sensor output values of the respective sensors 24 and 25, to the ECU 11.

The ECU 11 is configured to perform input capture (IPC) interrupt processing operation as shown in FIG. 15.

The ECU 11 begins the input capture interrupt processing operation at intervals of a predetermined time, and the input capture circuit 12 and signal processing circuit 14 execute the pieces of processing of steps described below.

First, the input capture circuit 12 receives the transmission signal SG of the sensor unit 21, measures and acquires the duty time td1 of the transmission signal SG (step 401), and then measures and acquires the PWM cycle tb of the transmission signal SG (step 402).

The order of executing the processing of step 401 and the processing of step 402 may be reversed.

Thereafter, the signal processing circuit 14 checks whether the PWM cycle tb obtained through the processing of step 401 is equal to or greater than the PWM cycle t100b of the transmission signal SG exhibiting, as shown in FIG. 13A, the duty cycle of 100% (step 403). When the PWM cycle tb is equal to or greater than the PWM cycle t100b (Yes at step 403), the signal processing circuit 14 performs processing of step 404. When the PWM cycle tb falls below the PWM cycle t100b (No at step 403), the signal processing circuit 14 performs processing of step 405.

A variance occurs in the precision in the PWM cycle tb due to a difference between the timer resolution of the input capture circuit 12 and the timer resolution of the output comparison circuit 22. Therefore, the PWM cycle tb may be equal to or greater than the PWM cycle t100b.

Therefore, when the PWM cycle tb is equal to or greater than the PWM cycle t100b, the PWM cycle tb can be regarded as the PWM cycle t100b.

In addition, since a variance occurs in the precision in the duty time td1 due to the difference between the timer resolutions of the respective circuits 12 and 22, the duty time td1 may deviate from the fixed value of 0.1 ms.

Herein, since the variance in the precision (timer precision) in the pulse width between the timer clocks produced by the timer circuits 13 and 23 respectively leads to the difference between the timer resolutions of the respective circuits 12 and 22, the difference between the timer resolutions is regarded as a timer precision difference.

At step 404, the signal processing circuit 14 recognizes the duty time td1, which is obtained through the processing of step 401, as the duty time t100d1, and recognizes the PWM cycle tb, which is obtained through the processing of step 402, as the PWM cycle t100b of the transmission signal SG exhibiting, as shown in FIG. 13A, the duty cycle of 100%.

At step 405, the signal processing circuit 14 checks whether the PWM cycle tb obtained through the processing of step 401 is equal to or less than the duty time t0d1 of the transmission signal SG exhibiting, as shown in FIG. 13B, the duty cycle of 0%. When the PWM cycle tb is equal to or less than the duty time t0d1 (Yes at step 405), the signal processing circuit 14 performs processing of step 406. When the PWM cycle tb exceeds the duty time t0d1 (No at step 405), the signal processing circuit 14 performs processing of step 408.

A variance occurs in the precision in the PWM cycle tb due to a difference between the timer resolution of the input capture circuit 12 and the timer resolution of the output comparison circuit 22 (timer precision difference). Therefore, the PWM cycle tb may be equal to or less than the PWM cycle t0b.

Therefore, when the PWM cycle tb is equal to or less than the PWM cycle t0b, the PWM cycle tb can be regarded as the PWM cycle t0b.

At step 406, the signal processing circuit 14 recognizes the duty time td1, which is obtained through the processing of step 401, as the duty time t0d1, and recognizes the PWM cycle tb, which is obtained through the processing of step 402, as the PWM cycle t0b of the transmission signal SG exhibiting, as shown in FIG. 13B, the duty cycle of 0%.

Thereafter, the signal processing circuit 14 calculates a duty cycle correction factor k according to the equation (7) below on the basis of the duty times t100d1 and t0d1 and the PWM cycles t100b and t0b which are recognized through the pieces of processing of steps 404 and 406 (step 407).

Here, 0.8 in the equation (7) is a value obtained by subtracting the time equivalent to two dead bands (=0.2 ms) from the time of the PWM cycle tb.

The order of executing the pieces of processing of steps 403 and 404 and the pieces of processing of steps 405 and 406 may be reversed.

$$k=0.8/(t100d1 \times t100b - t0d1 \times t0b) \quad (7)$$

At step 408, the signal processing circuit 14 calculates receiving data (ms) according to the equation (8) below on the basis of the duty time td obtained through the processing of step S401, the PWM cycle tb obtained through the processing of step 402, and the duty cycle correction factor k obtained through the processing of step 407.

Here, 0.2 in the equation (8) is a value representing the time equivalent to two dead bands within the PWM cycle tb.

After executing the processing of step 408, the ECU 11 terminates the input capture interrupt processing operation.

$$D1 = k \times td1 \times td - 0.2 \quad (8)$$

During the processing of step 304 shown in FIG. 14, the signal processing circuit 26 of the sensor unit 21 multiplexes, similarly to that in the first embodiment, data of 10 bits long of a pressure sensor output value and data of 6 bits long of a temperature sensor output value, and thus produces compressed data having the data items compressed thereinto.

The signal processing circuit 14 of the ECU 11 operates as shown in FIG. 16A to FIG. 16D during the processing of step 408 shown in FIG. 15.

In FIG. 16A to FIG. 16D, bits forming data of a temperature sensor output value are indicated with boldfaced squares.

As shown in FIG. 16A, the signal processing circuit 14 appends data of 18 bits long equivalent to 0.5 LSB to data of 14 bits long that has the PWM cycle tb and is obtained through the processing of step 401 shown in FIG. 15, and thus extends the data of 14 bits long so as to produce data of 32 bits long.

Herein, the data having the PWM cycle tb is 14 bits long is used because the input capture circuit 12 of the ECU 11 can receive the transmission signal SG of 14 bits long without fail.

The data having the PWM cycle tb is extended to the data of 32 bits long because the microcomputer included in the ECU 11 operates in the 32-bit architecture.

As shown in FIG. 16B, the signal processing circuit 14 calculates receiving data D1 according to the equation (8) on the basis of the PWM cycle tb extended to the length of 32 bits, the duty time td1 obtained through the processing of step 401 shown in FIG. 15, and the duty cycle correction factor k obtained through the processing of step 407 shown in FIG. 15.

Since the PWM cycle tb is extended to the length of 32 bits, the receiving data D1 becomes 32 bits long.

Thereafter, as shown in FIG. 16C and FIG. 16D, the signal processing circuit 14 separates, similarly to that in the first embodiment (FIG. 7C and FIG. 7D), the receiving data D1 into data of a pressure sensor output value of the pressure sensor 24 and data of a temperature sensor output value of the temperature sensor 25.

Operation and Advantage of the Fourth Embodiment

The sensor unit 21 produces and transmits as reference pulses the transmission signals SG, which exhibit the duty cycles of 100% and 0%, respectively, prior to transmission of the transmission signal SG based on the digital signal having data items compressed thereinto by the signal processing circuit 26.

The input capture circuit 12 of the ECU 11 measures the duty time td1 and PWM cycle tb of the transmission signal SG according to a timer clock produced by the timer circuit 13.

The signal processing circuit 14 of the ECU 11 produces the duty cycle correction factor k on the basis of the duty times t100d1 and t0d1 of the reference pulses (transmission signals SG exhibiting the duty cycles of 100% and 0% respectively) and the PWM cycles t100b and t0b thereof which are measured by the input capture circuit 12. The signal processing circuit 14 produces the receiving data D1 on the basis of the duty time td1 and PWM cycle tb of the transmission signal SG, which are measured by the input capture circuit 12, and the duty cycle correction factor k, and separates the receiving data D1 into the sensor output value of the pressure sensor 24 and the sensor output value of the temperature sensor 25 which are represented by digital signals existent before being multiplexed by the signal processing circuit 26.

Specifically, in the fourth embodiment, the signal processing circuit 26 fixes the duty time td1 of the transmission signal SG to a predetermined time (=0.1 ms) at every transmission of the transmission signal SG based on a digital signal having data items compressed thereto. The signal processing circuit 14 uses the duty cycle correction factor k to compensate for a variation from the fixed value, thus corrects the timer resolutions of the sensor unit 21 and ECU 11 respectively, and compensates the precision in the PWM cycle tb at every transmission of the transmission signal SG.

The timer circuit 13 of the ECU 11 and the timer circuit 23 of the sensor unit 21 have a difference in the timer resolution within a specification tolerance. The ratio of times equivalent to 1 LSB in the respective timer circuits 13 and 23 is reflected not only on the PWM cycle tb of the transmission signal SG but also on the duty time td1.

Therefore, the ECU 11 fixes the duty time td1 to a predetermined time (=0.1 ms), and corrects the PWM cycle tb at every receiving of the transmission signal SG.

Accordingly, even when a timer clock of the timer circuit 23 based on which the output comparison circuit 22 produces the transmission signal SG varies from a design value, the ECU 11 can acquire the correct PWM cycle tb of the transmission signal SG.

Therefore, since the timer precision of the timer circuit 23 may be low, the timer circuit 23 may be realized with an inexpensive circuit in order to accomplish a low cost.

Any special circuits are not used as the ECU 11 and sensor unit 21.

According to the fourth embodiment, the PWM communication system capable of performing high-precision multiplex communication can be provided at low cost.

In addition, according to the fourth embodiment, when the sensor output values of the respective sensors 24 and 25 are small, the PWM cycle tb gets shorter. A quantity that should be more sensitively sensed is set to a smaller value regarded as a sensor output value. For the sensor output value that should be sensitively sensed, PWM communication can be performed at intervals of 0.2 ms at the shortest rate. For a sensor output value that may be insensible, PWM communication can be performed at intervals of 1 ms at the latest rate.

Therefore, according to the fourth embodiment, higher-speed communication than that in the first embodiment can be achieved.

Fifth Embodiment

A sensor unit 21 is configured to operate as shown in FIG. 17 in a fifth embodiment.

The fifth embodiment is different from the first embodiment shown in FIG. 4 in that processing of step 105 is added between the processing of step 102 and the processing of step 103.

At step 105, the sensor unit 21 checks whether a repetitive frequency by which the pieces of processing of steps 101 and 102 are repeated (hereinafter, called a loop frequency) falls below a set frequency (step 105). When the loop frequency falls below the set frequency (Yes at step 105), that is, the loop frequency is low, the pieces of processing of steps 101 and 201 are repeatedly executed. When the loop frequency equals the set frequency (No at step 105), the sensor unit 21 executes the processing of step S103.

At step 103, the sensor unit 21 waits until both the sensor output values of the pressure sensor 24 and temperature sensor 25 respectively are finalized, and then executes the processing of step 104.

According to the fifth embodiment, once the set frequency for the loop frequency is set to an experimentally obtained optimal value, the ECU 11 can receive without fail the transmission signals SG (reference pulses) exhibiting the duty cycles of 100% and 0%, respectively, and being sent from the sensor unit 21.

Sixth Embodiment

A sensor unit 21 is configured to perform an operation shown in FIG. 18 in a sixth embodiment.

The sixth embodiment is different from the operations of the sensor unit 21 included in the first embodiment (FIG. 4) in that processing of step 106 is added between the processing of step 102 and the processing of step 103.

At step 106, the sensor unit 21 checks whether a time during which the pieces of processing of steps 101 and 201 are repeated (hereinafter, called a loop time) falls below a set time (step 105). When the loop time falls below the set time, that is, short loop time (Yes at step 105), the sensor unit 21 repeatedly executes the pieces of processing of steps 101 and 201. When the loop time equals the set time (No at step 105), the sensor unit 21 executes the processing of step 103.

At step 103, the sensor unit 21 waits until both the sensor output values of the pressure sensor 24 and temperature sensor 25 respectively are finalized, and executes the processing of step 104.

According to the sixth embodiment, once the set time for the loop time is set to an experimentally obtained optimal value, the ECU 11 can receive without fail the transmission signals SG (reference pulses) exhibiting the duty cycles of 100% and 0% respectively and being sent from the sensor unit 21.

Other Embodiments

The present invention is not limited to the foregoing embodiments but may be embodied differently as described below. Even in that case, an operation and advantage equal to or superior to those of any of the foregoing embodiments can be provided.

[1] In the first embodiment (FIG. 2), second embodiment (FIG. 9) and third embodiment (FIG. 11), the PWM cycle tb of the transmission signal SG is set to the fixed value of 1 ms. Alternatively, an appropriate predetermined cycle other than 1 ms may be designated as the fixed value according to the characteristics and sensor output values of the respective sensors 24, 25, 103 and 104.

[2] In the fourth embodiment (FIG. 12), the duty time td1 of the transmission signal SG is set to the fixed value of 0.1 ms. Alternatively, an appropriate predetermined time other than 0.1 ms may be designated as the fixed value according to the characteristics and sensor output values of the respective sensors 24 and 25.

In the fourth embodiment, the PWM cycle t100b of the transmission signal SG exhibiting the duty cycle of 100% is set to 1 ms. Alternatively, the PWM cycle may be set to an appropriate cycle other than 1 ms according to the sensor output values of the respective sensors 24 and 25.

[3] In the first and fourth embodiments (FIG. 6), the pressure sensor output value of the pressure sensor 24 is represented by data of 10 bits long, and the temperature sensor output value of the temperature sensor 25 is represented by data of 6 bits long.

However, the number of bits forming each of data items representing the sensor output values of the respective sensors 24 and 25 may be set to an appropriate number of bits according to the characteristic and sensor output value of each of the sensors 24 and 25.

In the first and fourth embodiments, three or more sensors may be included, and digital signals representing the sensor output values of the three or more sensors may be multiplexed and compressed into one data.

[4] In the second embodiment (FIG. 9) and third embodiment (FIG. 11), the signal level of the transmission signal SG is temporally varied in two steps.

Alternatively, the signal level of the transmission signal SG may be temporally varied in three or more steps. In this case, the same number of duty times as the number of steps can be convoluted into the one transmission signal SG.

[5] In the second embodiment (FIG. 8) and third embodiment (FIG. 10), the input capture circuit 12 in the ECU 101 includes two input ports for the duty times td1 and td2 respectively.

Alternatively, two input capture circuits dedicated to the duty times td1 and td2 may be included in the ECU 101, and each of the input capture circuits may be provided with one input port.

[6] In the first embodiment (FIG. 4), when the power supply is turned on, the sensor unit 21 produces and transmits as reference pulses the transmission signals SG which exhibit the duty cycles of 100% and 0%, respectively.

In the fourth embodiment (FIG. 14), when the power supply is turned on, the sensor unit 21 produces and transmits as reference pulses the transmission signals SG which exhibit the duty cycles of 100% and 0%, respectively.

Alternatively, the timing when the sensor unit 21 transmits the reference pulses is not limited to the timing when the power supply is turned on. As long as the timing of transmitting the reference pulses precedes transmission of the transmission signal SG associated with the sensor output values of the respective sensors 24 and 25, the timing of transmitting the reference pulses may be determined appropriately.

[7] In the foregoing embodiments, the transmission signal SG that is a PWM signal to be transmitted from the sensor unit 21 102, or 201 is a voltage signal whose voltage value varies.

Alternatively, the transmission signal SG that is a PWM signal may be a current signal whose current value varies. Thus, communication between the sensor unit 21, 102 or 201 and the ECU 11 or 101 may be realized with current communication.

In this case, when the wiring harness W2 that is a digital signal line over which the transmission signal SG is transmitted is also used as the wiring harness W1 that is a positive power line or a power line, the number of signal lines can further be decreased.

[8] The foregoing embodiments may be appropriately combined. In this case, the operations and advantages of the combined embodiments can be provided or a synergetic effect can be provided.

What is claimed is:

1. A PWM communication system comprising a transmitting device that transmits a transmission signal, a receiving device that receives the transmission signal transmitted from the transmitting device, and a signal line connecting the transmitting device and the receiving device,
    wherein the transmitting device includes:
        a transmitting-side signal processing circuit that multiplexes a plurality of digital signals to produce a digital data signal of one data having data items compressed thereinto;
        a transmitting-side timer circuit that produces a transmitting-side timer clock; and
        a transmission circuit that produces and transmits the transmission signal including the digital data signal according to the transmitting-side timer clock produced by the transmitting-side timer circuit,
        the transmission signal being a series of PWM signals, each of which has a PWM cycle fixed to a predetermined cycle and has a duty time variable in the predetermined cycle,
        the transmitting device producing and transmitting as reference pulses PWM signals of 100% duty time and 0% duty time, respectively, prior to transmission of the digital data signal, and
    wherein the receiving device includes:
        a receiving-side timer circuit that produces a receiving-side timer clock;
        a measurement circuit that measures the duty time and the PWM cycle of the transmission signal according to the receiving-side timer clock produced by the receiving-side timer circuit; and
        a receiving-side signal processing circuit that produces a duty correction factor based on duty times and PWM cycles of the reference pulses measured by the measurement circuit, produces receiving data based on the duty times and the PWM cycles of the digital dada signal, which are measured by the measurement circuit, as well as the duty correction factor, and separates the receiving data into a plurality of digital signals, which corresponds to the digital signals multiplexed by the transmitting-side signal processing circuit.

2. The PWM communication system of claim 1, wherein:
    the transmitting-side signal processing circuit collectively arranges the bits on least significant bit sides of the plurality of digital signals on the least significant bit side of the compressed data produced by compressing data items.

3. The PWM communication system of claim 1, wherein:
    the transmitting-side signal processing circuit appends a dither to the digital signal, which includes a least significant bit of the compressed data produced by compressing data items, out of the plurality of digital signals, and then multiplexes the plurality of digital signals; and
    the receiving-side signal processing circuit applies low-pass filtering, which is realized with a digital filter, to the digital signal, to which the dither is appended, out of the plurality of digital signals that are separated from each other, and thus finalizes the least significant bit of the digital signal.

4. The PWM communication system of claim 1, wherein:
    a signal level of the transmission signal is temporally varied in steps;
    the duty times or the PWM cycles are associated with the stepped temporal variations; and
    the plurality of duty times or the PWM cycles is convoluted into the sole transmission signal.

5. The PWM communication system of claim 1, wherein:
    the transmission signal is a current signal; and
    the transmitting device and the receiving device perform current communication.

6. A PWM communication system comprising a transmitting device that transmits a transmission signal, a receiving device that receives the transmission signal transmitted from the transmitting device, and a signal line connecting the transmitting device and the receiving device,
    wherein the transmitting device includes:
        a transmitting-side signal processing circuit that multiplexes a plurality of digital signals to produce a digital data signal of one data having data items compressed thereinto;
        a transmitting-side timer circuit that produces a transmitting-side timer clock; and
        a transmission circuit that produces and transmits the transmission signal including the digital data signal according to the transmitting-side timer clock produced by the transmitting-side timer circuit,
        the transmission signal being a series of PWM signals, each of which has a PWM cycle, which is variable, and a duty time fixed to a predetermined value,
        the transmitting device producing and transmitting as reference pulses PWM signals of 100% cycle and 0% cycle, respectively, prior to transmission of the digital data signal, and
    wherein the receiving device includes:
        a receiving-side timer circuit that produces a receiving-side timer clock;
        a measurement circuit that measures the duty time and the PWM cycle of the transmission signal according to the receiving-side timer clock produced by the receiving-side timer circuit; and
        a receiving-side signal processing circuit that produces a cycle correction factor based on duty times and PWM cycles of the reference pulses measured by the measurement circuit, produces receiving data based on the duty times and the PWM cycles of the digital dada signal, which are measured by the measurement circuit, as well as the cycle correction factor, and separates the receiving data into a plurality of digital signals, which corresponds to the digital signals multiplexed by the transmitting-side signal processing circuit.

7. The PWM communication system of claim 6, wherein:

the transmitting-side signal processing circuit collectively arranges the bits on least significant bit sides of the plurality of digital signals on the least significant bit side of the compressed data produced by compressing data items.

8. The PWM communication system of claim 6, wherein:

the transmitting-side signal processing circuit appends a dither to the digital signal, which includes a least significant bit of the compressed data produced by compressing data items, out of the plurality of digital signals, and then multiplexes the plurality of digital signals; and the receiving-side signal processing circuit applies low-pass filtering, which is realized with a digital filter, to the digital signal, to which the dither is appended, out of the plurality of digital signals that are separated from each other, and thus finalizes the least significant bit of the digital signal.

9. The PWM communication system of claim 6, wherein:

a signal level of the transmission signal is temporally varied in steps;

the duty times or the PWM cycles are associated with the stepped temporal variations; and the plurality of duty times or the PWM cycles is convoluted into the sole transmission signal.

10. The PWM communication system of claim 6, wherein:

the transmission signal is a current signal; and the transmitting device and the receiving device perform current communication.

* * * * *